United States Patent [19]

Crooks et al.

[11] 4,297,637

[45] Oct. 27, 1981

[54] METHOD AND APPARATUS FOR MAPPING LINES OF NUCLEAR DENSITY WITHIN AN OBJECT USING NUCLEAR MAGNETIC RESONANCE

[75] Inventors: Lawrence E. Crooks, Richmond; John C. Hoenninger, III, Berkeley; Mitsuaki Arakawa, Forest City, all of Calif.

[73] Assignee: The Regents of the University of California, Berkeley, Calif.

[21] Appl. No.: 926,571

[22] Filed: Jul. 20, 1978

[51] Int. Cl.$^3$ .............................................. G01N 27/00
[52] U.S. Cl. ..................................... 324/309; 324/307
[58] Field of Search .......... 324/0.5 R, 0.5 A, 0.5 AC, 324/309, 307

[56] References Cited

U.S. PATENT DOCUMENTS

| | | |
|---|---|---|
| 3,128,425 | 4/1964 | Codrington . |
| 3,213,355 | 10/1965 | Woessner . |
| 3,651,396 | 3/1972 | Hewitt et al. . |
| 3,781,650 | 12/1973 | Keller . |
| 3,789,832 | 2/1974 | Damadian . |
| 3,812,418 | 5/1974 | Tschopp . |
| 3,821,636 | 6/1974 | Bozanic ............................. 324/0.5 R |
| 3,932,805 | 1/1976 | Abe et al. . |
| 3,975,675 | 8/1976 | Dunand et al. . |
| 3,999,118 | 12/1976 | Hoult . |
| 4,015,196 | 3/1977 | Moore et al. . |
| 4,021,726 | 5/1977 | Garroway et al. . |
| 4,034,191 | 7/1977 | Tomlinson et al. . |
| 4,068,161 | 1/1978 | Ernst ............................... 324/0.5 R |
| 4,070,611 | 1/1978 | Ernst . |
| 4,087,738 | 5/1978 | Van Degrift et al. . |
| 4,095,168 | 6/1978 | Hlavka . |

OTHER PUBLICATIONS

E. R. Andrew, "Zeumatography", IVth Ampere International Summer School, Sep. 1976.
R. Damadian et al., "NMR in Cancer: XVI. Fonar Image of the Live Human Body", *Physiol. Chem & Phys.* 9, (1977), pp. 98–108.
P. Mansfield, Multi-Planar Image Formation Using NMR Spin Echoes, Journal of Physics C, vol. 10, No. 3, pp. L55–L58, Feb. 14, 1977.
G. N. Holland et al., "A Colour Display Technique for NMR Imaging", *J. of Physics E.,* 10, (1977), pp. 714–716.
T. Baines et al., "An Improved Picture Display for NMR Imaging", *Journal of Physics E: Scientific Instruments,* 9, (1976), pp. 809–811.
P. C. Lauterbur, "Image Formation by Induced Local Internations: Examples Employing Nuclear Magnetic Resonance", *Nature,* vol. 242, Mar. 16, 1973, pp. 190–191.
L. Minkoff et al., "NMR in Cancer: XVII. Dewar for a 53-Inch Superconducting NMR Magnet", *Physiol. Chem. & Phys.* 9, (1977), pp. 101–109.
Ros Herman, "NMR Makes Waves in Medical Equipment Companies", *New Scientist,* Jan. 12, 1978, p. 67.
R. Damadian et al., "Field Focusing Nuclear Magnetic Resonance (FONAR): Visualization of a Tumor in a Live Animal", *Science,* vol. 194, Dec. 24, 1976, pp. 1430–1431.
L. E. Crooks et al., "Tomographic Imaging with Nuclear Magnetic Resonance", *Investigative Radiology* 13, 63, Jan.–Feb. 1978.
W. S. Hinshaw et al., "Radiographic Thin-Section Image of the Human Wristby Nuclear Magnetic Resonance", *Nature,* vol. 270, 22/29, Dec. 1977, pp. 722–723.
W. S. Hinshaw, "Image Formation by Nuclear Magnetic Resonance: The Sensitive-Point Method", *J. of Applied Physics,* vol. 47, No. 8, Aug. 1976, pp. 3709–3721.
T. C. Farrar et al., "Pulse and Fourier Transform NMR –Introduction to Theory and Methods", Academic Press, 1971, New York, pp. 1–33.
E. R. Andrew et al., "NMR Images by the Multiple Sensitive Point Method: Application to Larger Biological Systems", *Phys. Med. Biol.,* 1977, vol. 22, No. 5, pp. 971–974.
A. Kumar et al., "NMR Fourier Zeugmatography", *J. Magnetic Resonance* 18, 69–83, (1975).
P. C. Lauterbur et al., "Magnetic Resonance Zeugmatography", 18th Amper. Conf. 1974.
P. Mansfield et al., "Diffraction and Microscopy in Solids and Liquids by NMR", 18th Ampere Conference, 1974, pp. 431–432.
W. S. Hinshaw et al., "Display of Cross Sectional Anatomy by Nuclear Magnetic Resonance Imaging", *British Journal of Radiology,* 51, Apr. 1978, pp. 273-280.

P. Mansfield et al., "Biological and Medical Imaging by NMR", *Journal of Magnetic Resonance* 29, pp. 355-373, (1978).

P. Mansfield et al., "Planar Spin Imaging by NMR", *Journal of Magnetic Resonance* 27, pp. 101-119.

G. N. Holland et al., "Communications", *Journal of Magnetic Resonance* 38, pp. 133-136, (1977).

P. C. Lauterbur, "Magnetic Resonance Zeugmatography".

P. C. Lauterbur, "Flow Measurements by NMR Zeugmatography", Oct. 24, 1973.

P. C. Lauterbur, "Stable Isotope Distributions by NMR Zeugmatography", *Proceedings of the First International Conference on Stable Isotopes in Chemistry, Biology, and Medicine,* Conf-730525, May 9-18, 1973, pp. 255-260.

P. C. Lauterbur et al., "ESR Zeugmatography–Distributions of Unpaired Electrons within Objects", Gordon Conference on Magnetic Resonance, Aug. 12-16, 1974.

P. C. Lauterbur et al., "In Vivo Studies of Cancer of NMR Zeugmatography", Gordon Conference on Magnetic Resonance, Aug. 12-16, 1974.

P. C. Lauterbur, "Reconstruction in Zeugmatography—The Spatial Resolution of Magnetic Resonance Signals", International Workshop on Three-Dimensional Image Reconstruction Techniques, Jul. 16-19, 1974.

A. N. Garroway, "Velocity Profile Measurements by NMR", 18th Ampere Conference, 1974, pp. 435-436.

W. S. Hinshaw, "The Application of Time Dependent Field Gradients to NMR Spin Mapping", 18th Ampere Conference, 1974, pp. 433-434.

J. M. S. Hutchinson et al., "In Vivo Imaging of Body Structures Using Proton Resonance", 18th Ampere Conference 1974, pp. 283-284.

P. Mansfield et al., "Line Scan Proton Spin Imaging in Biological Structures by NMR", *Phys. Med. Biol.,* 1976, vol. 21, No. 5, pp. 847-852.

P. K. Grannel, "NMR Body Images", *Physics Bulletin,* Mar. 1976, pp. 95-96.

P. C. Lauterbur et al., "Zeugmatographic High Resolution Nuclear Magnetic Resonance Spectroscopy, Images of Chemical Inhomogeneity within Macroscopic Objects", *American Chemical Society Journal,* 97:23, Nov. 12, 1975, pp. 6866-6868.

P. Mansfield et al., "Diffraction and Microscopy in Solids and Liquids by NMR", *Physical Review B,* vol. 12, No. 9, Nov. 1, 1975, pp. 3618-3634.

P. Mansfield et al., "Fast Scan Proton Density Imaging by NMR", *J. of Physics E,* vol. 9, 1976, pp. 271-278.

P. C. Lauterbur, "Bibliography on Magnetic Resonance Zeugmatography", Jun. 3, 1975, pp. 1-2.

A. N. Garroway et al., "Image Formation in NMR by a Selective Irradiative Process", *J. Phys. C:* vol. 7, 1974, pp. 457-462.

P. Mansfield et al., "Medical Imaging by NMR", *British Journal of Radiology* 50, 1977, pp. 188-194.

D. I. Hoult, "Zeugmatography: A Criticism of the Concept of a Selective Pulse in the Presence of a Field Gradient", *Journal of Magnetic Resonance* 26, 165-167, (1977).

P. Mansfield et al., "Planar Spin Imaging by NMR", *J. Phys. C: Solid State Phys.,* vol. 9, 1976, pp. L409-L412.

P. Mansfield, "Proton Spin Imaging by Nuclear Magnetic Resonance", *Contemporary Physics,* vol. 17, No. 6, 1976, pp. 553-576.

*Primary Examiner*—Michael J. Tokar
*Attorney, Agent, or Firm*—Larry S. Nixon

[57] ABSTRACT

Densities of resonant nuclei within elemental volumes along a line are measured using the nuclear magnetic resonance phenomenon called "spin echo." A first planar volume of nuclei is selectively excited to nutate spins by approximately 90°. Thereafter a second planar volume of nuclei, transverse to the first planar volume, is selectively excited to nutate spins by approximately 180°. The nuclei in the line volume common to both of the planar volumes thereafter generate characteristic spin echo signals. A magnetic gradient is established along this line volume during the spin echo read out so that the resultant spin echo signals can be processed to determine the respective densities of resonant nuclei along the line volume. Special pulsing sequences for rapidly effecting measurement of successive multiple line volumes and suitable apparatus for effecting such sequences are also described.

35 Claims, 14 Drawing Figures

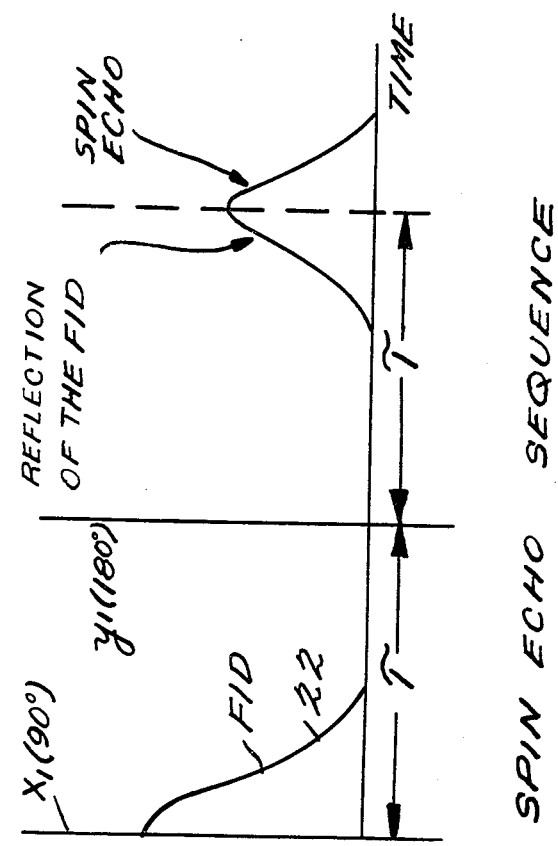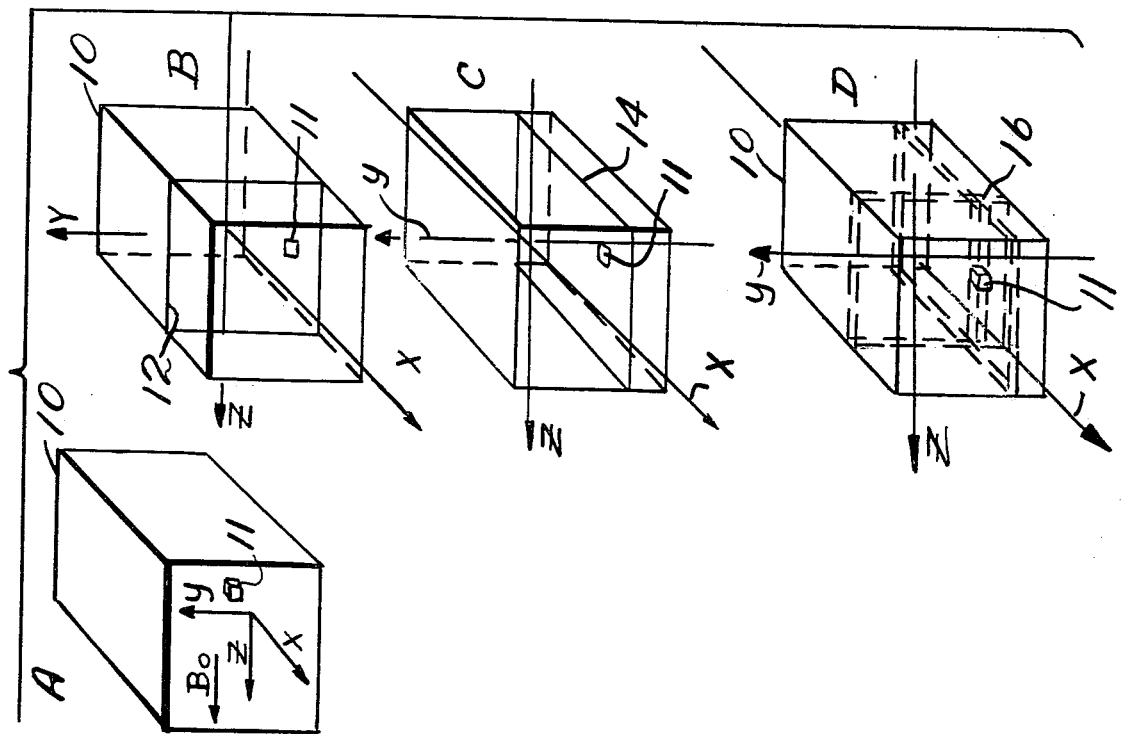

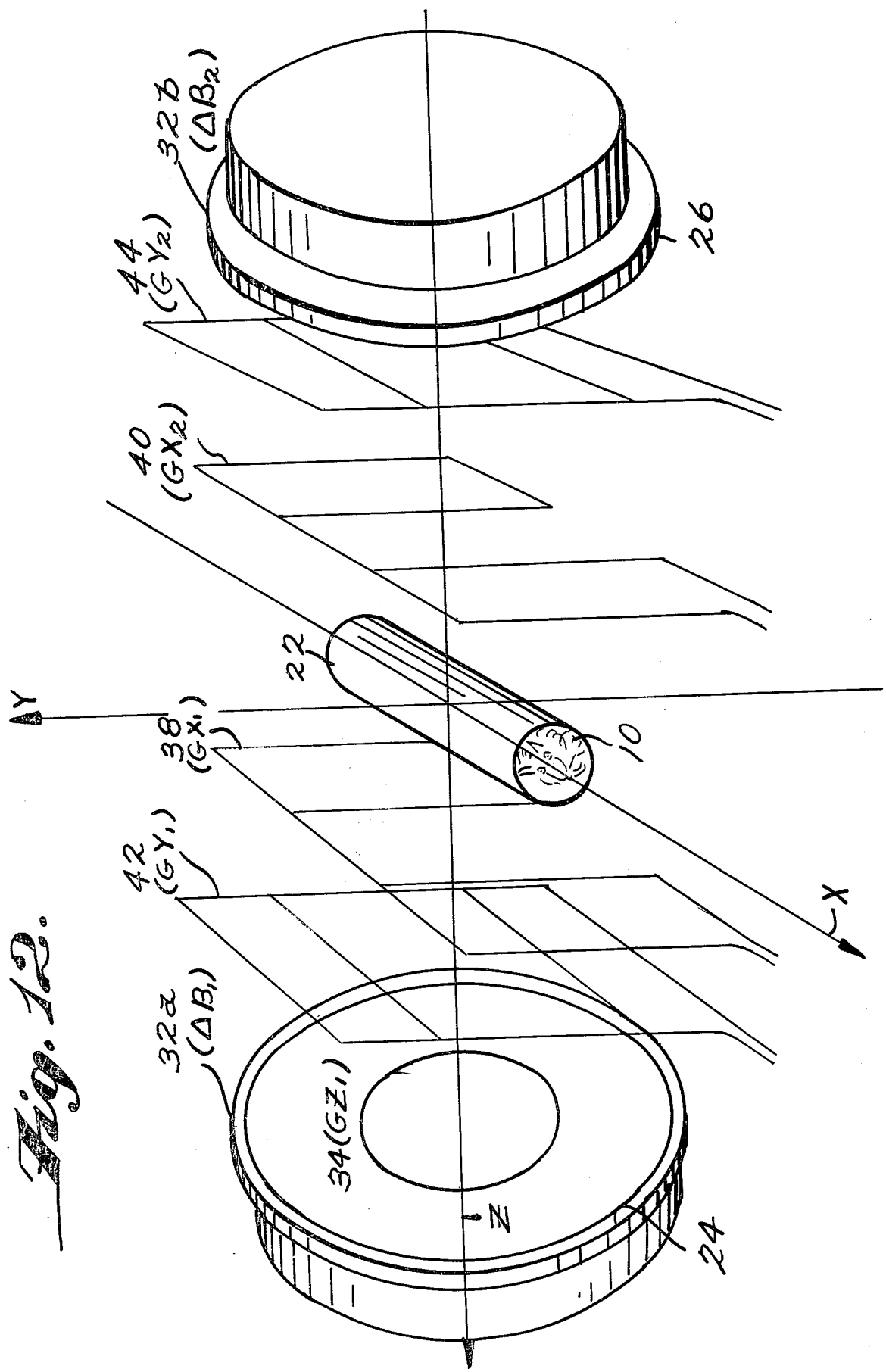

METHOD AND APPARATUS FOR MAPPING LINES OF NUCLEAR DENSITY WITHIN AN OBJECT USING NUCLEAR MAGNETIC RESONANCE

FIELD OF THE INVENTION

The present invention relates to apparatus and method for producing a cross-sectional image of relative nuclear densities inside an object. More particularly, it involves the use of nuclear magnetic resonance techniques for in vivo mapping of lines of resonant nuclei densities in a human or other animal.

BACKGROUND OF THE INVENTION

Presently used techniques for non-invasive examination of a body use X-ray (e.g., computerized tomography) and ultrasound procedures. Another noninvasive procedure uses nuclear magnetic resonance (NMR) to obtain a cross-sectional image of the nuclei densities within a body. The average atomic number (Z) of nuclei in tumors tends to be significantly different from that of normal tissue. Hydrogen nuclear densities detected by NMR techniques are presently considered a strong indicator of changes in the average atomic number Z in tissues since hydrogen is the most abundant odd mass numbered nucleus present in living tissues. NMR is ideally suited for mapping relative hydrogen nuclear densities within living tissues.

In general, the principles of NMR are well known. All nuclei with an odd number of protons and neutrons (i.e., odd mass number) behave, in effect, like small magnets. When placed in a steady external magnetic field, the magnetic axis of such nuclei (and hence of the atoms) precesses at an angle about the imposed field axis, and develops a magnetic moment or "spin" at a so-called Larmor frequency. The Larmor frequency ($f_o$) is related to the magnetic field ($B_0$) at the nucleus by the equation $f_o = 2\pi\gamma B_0$ where $\gamma$ is a constant, the magnetogyric ratio characteristic of a particular type of nuclei.

As is well known, the direction of net angular momentum or "spin" of a group of nuclei (and thus their net magnetic axis) can be reoriented with respect to the external magnetic field by electromagnetic signals having a frequency equal to the Larmor frequency. The electromagnetic signal nutates (reorients) the net spin of resonant (Larmor frequency) nuclei by an amount in accordance with its amplitude and duration. The direction of nutation is a function of the phase of the electromagnetic signal with respect to the nuclear precession about the imposed magnetic field.

Assuming the nuclear spins to be initially aligned, and then reoriented transverse to the initial direction, the changing orientations of nuclei magnetic axes will induce a characteristic RF signal in a coil connected to an RF signal receiver. Repolarization (realignment with respect to the imposed field) will thereafter occur in accordance with a spin-lattice (longitudinal) relaxation time $T_1$.

Where a magnetic field gradient exists through an object, or if non-homogeneities exist in the imposed magnetic field, nuclei having the same magnetogyric ratio $\gamma$ will have different Larmor frequencies in accordance with their positions within the object. A volume of nuclei in the object can thus be conceptualized as having a range of precession frequencies centered about a given Larmor frequency.

It is convenient to view the nuclear process now being described from a rotating frame of reference which rotates at the Larmor frequency such that a nuclear magnetic moment $\mu$ precessing at exactly the Larmor frequency appears to be stationary. In this frame of reference, the macroscopic magnetization M is nominally aligned (until reoriented) with the direction of the imposed magnetic field $B_0$.

As nuclear realignment occurs, the relative phases of the individual spins (where phase is defined as the angle between the projection of the spin on a plane in the rotating reference frame and an axis, in this plane, which passes through the axis of rotation) begin to diverge as some nuclei precess faster and some slower than the central Larmor frequency. Thus, there is a gradual "dephasing" of the individual nuclear spins and a consequent loss of phase coherence. Initially upon reorientation, a relatively strong voltage is induced in the receiver coils which gradually decreases in amplitude due to energy exchange between spins (spin-spin relaxation time constant $T_2$) and such dephasing of the spins both of which are cumulatively characterized by relaxation time $T_2^*$. This signal is called the free induction decay (FID).

As is also well known, a "spin echo" or subsequent representation of the FID can be generated by bringing the respective spins back into phase coherence.

For example, if, at a time $\tau$ after the nuclear spins are reoriented (for example 90° with respect to an initial direction), by a first electromagnetic pulse of appropriate frequency, magnitude and duration (hereinafter referred to as a 90° pulse), another electromagnetic signal of appropriate frequency, magnitude and duration is applied to effect a 180° nutation of the nuclear spins (hereinafter referred to as a 180° pulse) each individual spin is effectively rotated by 180° (in the rotating frame of reference). This means that the phase is now the negative of phase accumulated before the 180° pulse. The accumulation of further phase deviations for individual nuclear spins is the same as before and therefore, at time $2\tau$ (after the initial disturbance) all of the individual spins again come into phase coherence (the negative phase cancels the further accumulated phase). In this manner, a so-called "spin echo" of the FID is generated. The peak amplitude of the spin echo is dependent upon the transverse relaxation time constant $T_2$. The spin echo, in effect, comprises a mirror image and echo of the FID centered about a time $2\tau$ after the initial disturbance.

It should be noted that the spin echo is always peak at a time period after the application of the 180° pulse which is equal to the time interval between application of the initial disturbance (90° pulse generating the FID) and the application of the 180° pulse. This phenomenon shall hereinafter be referred to as the "rule of equal times."

For a more detailed description of the basic principles of NMR, reference is made to Farrar and Becker "Pulse and Fourier Transform NMR Introduction to Theory and Methods," Academic Press, New York, 1971.

While NMR techniques have long been utilized in measurement of magnetic fields and chemical analysis, NMR has only recently been applied to medical imaging applications. In general, NMR imaging techniques are based upon the premise that by purposefully disposing a specimen within a position-variant magnetic field (a field having an intensity which varies in accordance with position), the Larmor frequencies of the nuclei disposed at different position are made to differ accordingly. Thus, a frequency discriminant is provided as between spins from atoms at differing positions, and the spin-density of a unit or element of volume within the excited volume of nuclei is represented by a particular frequency component of the FID.

Imaging techniques utilizing NMR typically fall within five categories: imaging from projections; FONAR; sensitive point imaging; Fourier imaging; and imaging by selective irradiation.

The imaging from projections technique entails producing a multiplicity of projections from many different orientations by, for example, generating a linear field gradient within the object and recording a one dimensional projection of nuclear density in the direction defined by the gradient. An image is then reconstructed from the projections by mathematic techniques similar to those used in X-ray tomography. Such a method is described, for example, by Lauterbur, *Nature,* 242:190, March 1973.

The FONAR technique utilizes shaped magnetic fields applied across the object such that only a small resonant window within the sample produces an NMR signal. The sensitive region is then scanned through the object, for example, by physical movement. For a description of the FONAR technique, reference is made to Damadian et al., "Focusing Nuclear Magnetic Resonance (FONAR)" Visualization of a Tumor in a Live Animal, *Science,* Vol. 194, pp. 1430-1432, December 1976 and to U.S. Pat. No. 3,789,832 issued Feb. 5, 1974 to Damadian.

The sensitive point imaging technique, also known as spin mapping, is a method whereby the NMR signal from particular unit volumes are recorded in sequence. A magnetic field gradient, alternating at a predetermined low frequency (on the order of 50 Hz) is generated along one axis of the object. The NMR signal from all elements in the object are thus modulated at the frequency of the gradient change, with the exception of the protons located in the null plane (zero plane) of the gradient. Similar alternating gradients can be applied at asynchronous frequencies along transverse axes to, in effect, define a null point in the object at the intersection of the gradient null planes. Appropriate lowpass filtering thus provides an indication of the NMR signal from the point of intersection of the three null planes. Raster-type scanning of the object is provided by varying the relative gradients. Such a sensitive point imaging technique is described in Hinshaw, *Journal of Applied Physics,* Vol. 47, No. 8, August 1976.

A multiple sensitive point method utilizing two orthogonal alternating gradients to define a null line and a string of coherent, equally spaced phase alternated resonant radio frequency pulses, is alluded to in Andrew et al., "NMR Images by Multiple Sensitive Point Method, Application to Larger Biological Systems," *Phys. Med. Biol.* 1977, Vol. 22, No. 5, 971-974, 1977. It is stated that discrete Fourier transformation of the signal received between RF pulses is utilized to provide indicia of the proton density along the line of intersection of two alternating gradient null planes.

Fourier imaging techniques generally employ an initial RF pulse to reorient the spins of the protons in the object by 90°. During the resultant FID signal, the object is subject to successive gradients applied consecutively in quick succession along the three principal Cartesian axes of the system. The FID signal is sampled in the presence of the last applied gradient, and a three dimensional Fourier transform is performed to develop a three dimensional image. Two dimensional Fourier transform methods are also known. For a discussion of the Fourier NMR techniques, reference is made to Kumar et al., "NMR Fourier Zeugmatography" *Journal of Magnetic Resonance* 18:69-83 (1975).

Imaging by selective irradiation techniques entails use of a sequence of electromagnetic pulses with predetermined frequency spectrums. A first magnetic gradient is applied along a given axis and the object is irradiated by a sequence of electromagnetic pulses having a combined frequency spectrum having equal intensity at all Larmor frequencies across the object with the exception of a narrow band. As a result of the irradiation, all of the nuclei within the object, with the exception of a narrow plane, will be saturated. The saturated atoms are thereby rendered non-responsive to further electromagnetic signals for a period of time on the order of the spin-lattice relaxation time constant $T_1$. The first magnetic/gradient is replaced by a gradient along an orthogonal direction and the object again irradiated by a sequence of electromagnetic pulses, this time having a bandwidth corresponding to a particular elementary strip within the unsaturated plane. The second sequence of pulses nutates the spins of the atoms within the predetermined strip by 90°, resulting in generation of an FID. The FID is then recorded in the presence of a magnetic gradient in the third orthogonal direction (along the direction of the strip) and a Fourier transform taken to provide the nuclear density distribution along the line. For a more detailed description of the imaging by selective irradiation, reference is made to U.S. Pat. No. 4,021,726 issued May 3, 1977 to Garroway et al.

For further descriptions of the above noted NMR imaging techniques, and other techniques, reference is made to the following articles:

P. C. Lauterbur et al., "Magnetic Resonance Zeugmatography" 18th Amper. Conf. 1974; P. Mansfield, P. K. Grannel and A. A. Maudsley, "Diffraction and Microscopy in Solids by NMR," 18th Amper. Conf. 1974, pp. 431-432; P. C. Lauterbur, "Magnetic Resonance Zeugmatography"; P. C. Lauterbur, "Flow Measurements by NMR Zeugmatography," Oct. 24, 1973; P. C. Lauterbur, "Stable Isotope Distributions by NMR," Proc. First International Conf. on Stable Isotopes Conf. 730525, May 9-18, 1973, pp. 255-260; P. C. Lauterbur, "Image Formation by Induced Local Interactions: Examples Employing Nuclear Magnetic Resonance," *Nature,* Vol. 242, Mar. 16, 1973, pp. 190-191; P. C. Lauterbur et al., "ESR Zeugmatography—Distributions of Unpaired Electrons Within Objects," Gordon Conf. Aug. 12-16, 1974; P. C. Lauterbur et al., "In Vivo Studies of Cancer by NMR Zeugmatography," Gordon Conf. Aug. 12-16, 1974; P. C. Lauterbur, "Reconstruction in Zeugmatography—The Spatial Resolution of Magnetic Resonance Signals," Intl. Workshop on 3-D Image Reconstruction Techniques, July 16-19, 1974; A. N. Garroway, "Velocity Profile Measurements by NMR," 18th Amper. Conf. 1974, pp. 435-436; W. S. Hinshaw, "The Application of Time Dependent Field Gradients to NMR Spin Mapping," 18th Amper. Conf. 1974, pp. 433-434; J. M. S. Hutchinson, J. R. Mallard and C. C. Goll, "In Vivo Imaging of Body Structures Using Proton Resonance," 18th Amper. Conf. 1974, pp. 283-284; P. Mansfield and A. A. Maudsley, "Line Scan Proton Spin Imaging in Biological Structures by NMR," *Phys. in Medicine and Biology* 21 No. 5 (1976), pp. 847-852; P. K. Grannel, "NMR Body Images," Physics Bulletin, March 1976, pp. 95-96; P. C. Lauterbur, D. M. Krammer, W. V. House, C. Chen, "Zeugmatographic High Resolution NMR Spectroscopy, Images of Chemical Inhomogeneity Within Macroscopic Objects," *American Chemical Society Journal,* 97:23, Nov. 12, 1975; P. Mansfield and P. K. Grannel, "Diffraction and Microscopy in Solids and Liquids by NMR," *Physical Review B,* Vol. 12, No. 9, Nov. 1, 1975, pp. 3618-3634; P. Mansfield, A. A. Maudsley and T. Baines, "Fast Scan Proton Density Imaging by NMR," *J. of Physics E,* Vol. 9, 1976, pp. 271-278; P. C. Lauterbur, "Bibliography on Magnetic Resonance Zeugmatography," June 3, 1975; A. N. Garroway, P. K. Grannel and P. Mansfield, "Image Formation in NMR by a Selective Irradiative Process," *J. Phys. C:* Vol. 7, 1974, pp. 457-462; A. Kumar, D. Welt and R. Ernst, "NMR Fourier Zeugmatography," *J. Mag. Res.* 18, 69-83 (1975); P. Mansfield and A. A. Maudsley, "Medical Imaging by NMR," *British Journal of Radiology* 50, 188-194 (1977); D. I. Hoult, "Zeugmatography: A criticism of the Concept of a Selective Pulse in the presence of a Field Gradient," *J. Mag. Res.* 26, 165-167 (1977); P. Mansfield and A. A. Maudsley, "Planar Spin Imaging by NMR," *J. of Physics C.,* Vol. 9, 1976, pp. L409-412; P. Mansfield, "Proton Spin Imaging by Nuclear Magnetic Resonance," *Contemporary Physics,* Vol. 17, No. 6, 1976 pp. 553-576; R. Damadian et al., "Field Focusing Nuclear Magnetic Resonance (FONAR): Visualization of a Tumor in a Live Animal," *Science,* Vol. 194, Dec. 24, 1976, pp. 1430-1431, E. R. Andrew, "Zeugmatography," IVth Amper. Summer School, Sept. 1976; W. S. Hinshaw, "Image Formation by Nuclear Magnetic Resonance: The Sensitive-Point Method," *J. of Applied Physics,* Vol. 47, No. 8, August 1976; R. Damadian, M. Goldsmith and L. Minkoff, "NMR in Cancer: XVI FONAR Image of the Live Human Body," *Physiol. Chem. and Phys.* 9, (1977), pp. 97-108; G. N. Holland and P. A. Bottomley, "A Colour Display Technique for NMR Imaging," *J. of Physics E:* 10 (1977), pp. 714-716; T. Baines and P. Mansfield, "An Improved Picture Display for NMR Imaging," *Journal of Physics E: Scientific Instruments* 9 (1976), pp. 809-811; E. R. Andrew et al., "NMR Images by the Multiple Sensitive Point Method: Application to Larger Biological Systems," *Physics in Medicine and Biology* 22, No. 5, 971-974 (1977); L. Minkoff, R. Damadian, T. E. Thomas, N. Hu, M. Goldsmith, J. Koutcher and M. Stanford, "NMR in Cancer: XVII. Dewar for a 53-Inch Superconducting NMR Magnet," *Physiol. Chem. and Phys.* 9 (1977), pp. 101-109; Ros Herman, "NMR Makes Waves in Medical Equipment Companies," *New Scientist,* Jan. 12, 1978; L. E. Crooks, T. P. Grover, L. Kaufman & J. R. Singer, "Tomographic Imaging with Nuclear Magnetic Resonance," *Investigative Radiology,* 13, 63 Jan-Feb. 1978; W. S. Hinshaw, P. A. Bottomley and G. N. Holland, "Radiographic Thin-Section Image of the Human Wrist by Nuclear Magnetic Resonance," *Nature,* Vol. 270, No. 22, 29 December, 1977, pp. 722-723; and T. C. Farrar and E. D. Becker, "Pulse and Fourier Transform NMR—Introduction to Theory and Methods," Academic Press, 1971, New York, pp. 1-33.

Further reference is made to U.S. Pat. Nos: 3,975,675 issued to Dunand et al. on Aug. 17, 1976; 4,021,726 issued to Garroway et al. on May 3, 1977; 4,015,196 issued to Moore et al. on Mar. 29, 1977; 4,034,191 issued to Tomlinson et al. on July 5, 1977; 3,789,832 issued to Damadian on Feb. 5, 1974; 3,932,805 issued to Abe et al. on Jan. 13, 1976; 3,651,396 issued to Hewitt et al. on Mar. 21, 1973; and 3,999,118 issued to Hoult on Dec. 21, 1976.

It should be appreciated that each of the above described techniques is disadvantageous in various aspects. For example, techniques developing an image from projections require extensive mathematical processing of the data. The FONAR technique apparently requires either an extremely complex system to scan the magnetic field, or some means for generating relative movement between the field and the subject.

The three dimensional Fourier transform techniques require that all planes be scanned simultaneously a multiplicity of times in order to develop sufficient data so that data from the various planes can be mathematically separated. In two dimensional Fourier transform techniques the repetition rate is limited by the $T_1$ spin-lattice relaxation time of the nuclei since each irradiation affects the entire spin system. Further, large amounts of computer storage is required.

Imaging techniques utilizing selective irradiation wherein the entire object is saturated with the exception of a single plane are disadvantageous in that such systems cannot readily be adapted for rapid sequential scanning of multiple planes. That is, before a second plane can be addressed a sufficient time must pass for the object to become unsaturated.

The present invention is directed to a technique utilizing selective irradiation of the object by electromagnetic pulses to generate spin echoes (as opposed to the detection of the free induction decay signals (FID)) to readily provide for rapid multiple plane scanning.

In general, as noted above, the phenomenon of spin echoes is well known. In the past, however, the spin echo has been used primarily for measurement of the transverse relaxation time constant $T_2$ of a specimen. An example of a system utilizing spin echoes for the measurement of the relaxation time $T_2$ in logging earth formations traversed by a bore hole, is described in U.S. Pat. No. 3,128,425 issued Apr. 7, 1964 to Codrington. Similarly, U.S. Pat. No. 3,213,355 issued to Woessner on Oct. 19, 1965 describes a system for measuring the dimensions of a container utilizing spin echoes to determine the transverse relaxation time $T_2$.

Mansfield and Maudsley, "Planar Spin Imaging by NMR," *J. Phys. C: Solid State Physics,* Vol. 9, 1976 (noted above), appears to indicate that after an FID has decayed, various signal-refocusing arrangements (selective 180° pulses, 90° pulses and various combinations with field gradient reversals) may be employed to recall the signal for signal averaging purposes. The specific mechanism of the refocusing arrangements, however, is not described in the article. In a similar vein, U.S. Pat. No. 3,781,650 issued Dec. 25, 1973 to Keller appears to describe an NMR spectrometer wherein FIDs and spin echoes are combined for purposes of interference reduction.

Also, in the aforementioned communication by Hoult (Journal of Magnetic Resonance, 26: 165-167 (1977)), it is stated that the selective irradiation techniques violate the "Uncertainty Principle" unless non-linearities present in the NMR system are exploited. Hoult states that a square selective pulse contains a wide spectrum of frequencies, and that during the time the pulse is applied the "flipped spins" dephase. However, he further contends that the situation is not irretrievable in that if the field gradient is reversed after the pulse, an echo of the pulse is formed, and in the middle of the echo for small phase angle pulses, all of the spins are in phase.

Hoult's communication implies that the shape of the selected region is essentially identical to the shape of the spectrum of the selective irradiation. However, the present inventors have noted that since the response of nuclear spins to RF magnetic field is non-linear that the shape of selected volume does not exactly correspond to the shape of the spectrum of the exciting RF magnetic field. For example a spectrum with a perfectly square block of frequencies will excite a volume which covers a frequency range slightly wider than the block of frequencies and the edges of the excited volume are sloped rather than vertical. The shape of the excited volume can be calculated using the Block equations, described in Farrar and Becker pages 7 and 8, with an appropriate time dependent RF magnetic field having the frequency spectrum being considered. The use of the Block equations also determines the spin dephasing which occurs during the RF pulse. It can be shown, thus, that Hoult's gradient reversal suggestion works even for flip angles that are not small. For a 90° flip angle the gradient reversal needed to achieve a maximum signal from the spins in the selected volume is a reversed gradient with the same strength as the original but with a duration which is about half the duration of the irradiation. The exact duration of the reversal gradient is dependent on the shape of the RF pulse. The effect of this reversed gradient is to recluster most of the spins which dephased during the selective irradiation. Since the dephasing during the selective irradiation is not linear the rephasing is not perfect, but it is substantial. After the termination of the reversed gradient one has a signal which we will consider to be an FID although Hoult calls it an echo. The other large flip angle which will be frequently used is 180°. A selective irradiation of this value requires no phase correction. The reason is that spin dephasing during the first 90° of the flip is cancelled by rephasing during the second 90° of the flip.

The gradient reversal after a selective irradiation is one of several types of phase corrections necessary to the operation of the line mapping techniques described herein. Application of a reversed gradient for a period about half the duration of the selective irradiation will be hereinafter referred to as Type I phase correction. In practice the area under the correction gradient versus time waveform is the critical factor. If the correction gradient were twice as strong it would only have to be applied for half the time. This applies to all the types of phase corrections and the descriptions use the example of equal strengths only for simplicity. A second type of phase correction, hereinafter referred to as a Type II phase correction, is immediate correction for a gradient pulse that has just ended; the phase spreading which occurs in parts of the object not subject to a selective irradiation during the application of this gradient pulse is corrected by the immediate application of an equal and opposite gradient for the same amount of time as the original gradient pulse. An extension of a Type II phase correction is to allow a delay time before the correction gradient is applied. Events such as spin echoes may be observed during this delay time. Such a phase correction wherein an opposite polarity gradient is applied after a delay time will be referred to as a Type III phase correction. A further type of phase correction (Type IV) is similar to a Type III correction, except that a 180° RF pulse is applied to the volume of interest during the period between the application of the original and correction gradients, such that the polarity of the correction gradient will be the same as that of the first gradient. The correction gradient has the same polarity as the first gradient because the intervening 180° RF pulse makes the phases negative.

SUMMARY OF THE INVENTION

The present invention is directed to a method of selective irradiation imaging wherein direct analysis of the spin echo (as opposed to analysis of the FID) provides for rapid sequential scanning of plural planes (planar volumes) within the object. A predetermined number of parallel planes are sequentially selectively excited such that the spins of the atoms (nuclei) disposed therein are reoriented by approximately 90°. A predetermined number of transverse planes within the object are then selectively excited to reorient the spins of the atoms therein by 180°. The nuclei disposed in the respective intersections of the 90° reoriented planes and 180° reoriented planes subsequently produce spin echo signals at times in accordance with the rule of equal times. The spin echo signals are thus generated during a sequence of respective time periods. By measuring the spin echoes in the presence of a position variant magnetic field along the line of intersection, the spin densities of unit volumes within each individual intersection can be provided by Fourier transforming the respective spin echo signals.

If the sets of repeated read outs of a particular line occur too often $T_1$ effects will decrease the signal strength from the unit volumes. Thus the signal strength indicates the combined effects of spin density and $T_1$. Volume elements with long $T_1$s would have lower than normal "apparent" spin densities. Volume elements with short $T_1$s will show very little change from their true spin density. This effect allows the construction of a $T_1$ image by making several "apparent" spin density images using shorter and shorter times between sets of repeated read outs. The decrease of apparent density as a function of the time between repeated read outs can be used to calculate the $T_1$ of each volume element. The $T_1$s of all the volume elements can then be used to create a $T_1$ image of the object.

BRIEF DESCRIPTION OF THE DRAWINGS

FIGS. 1A–1D are pictorial schematics of an object subjected to one line scanning spin echo sequence in accordance with the present invention;

FIG. 3 is a schematic illustration of the spin echo sequence of FIGS. 1 and 2;

FIG. 12 is an expanded pictorial of a portion of the apparatus of FIG. 11, and

DETAILED DESCRIPTION OF PREFERRED EXEMPLARY EMBODIMENTS

Figure 2:
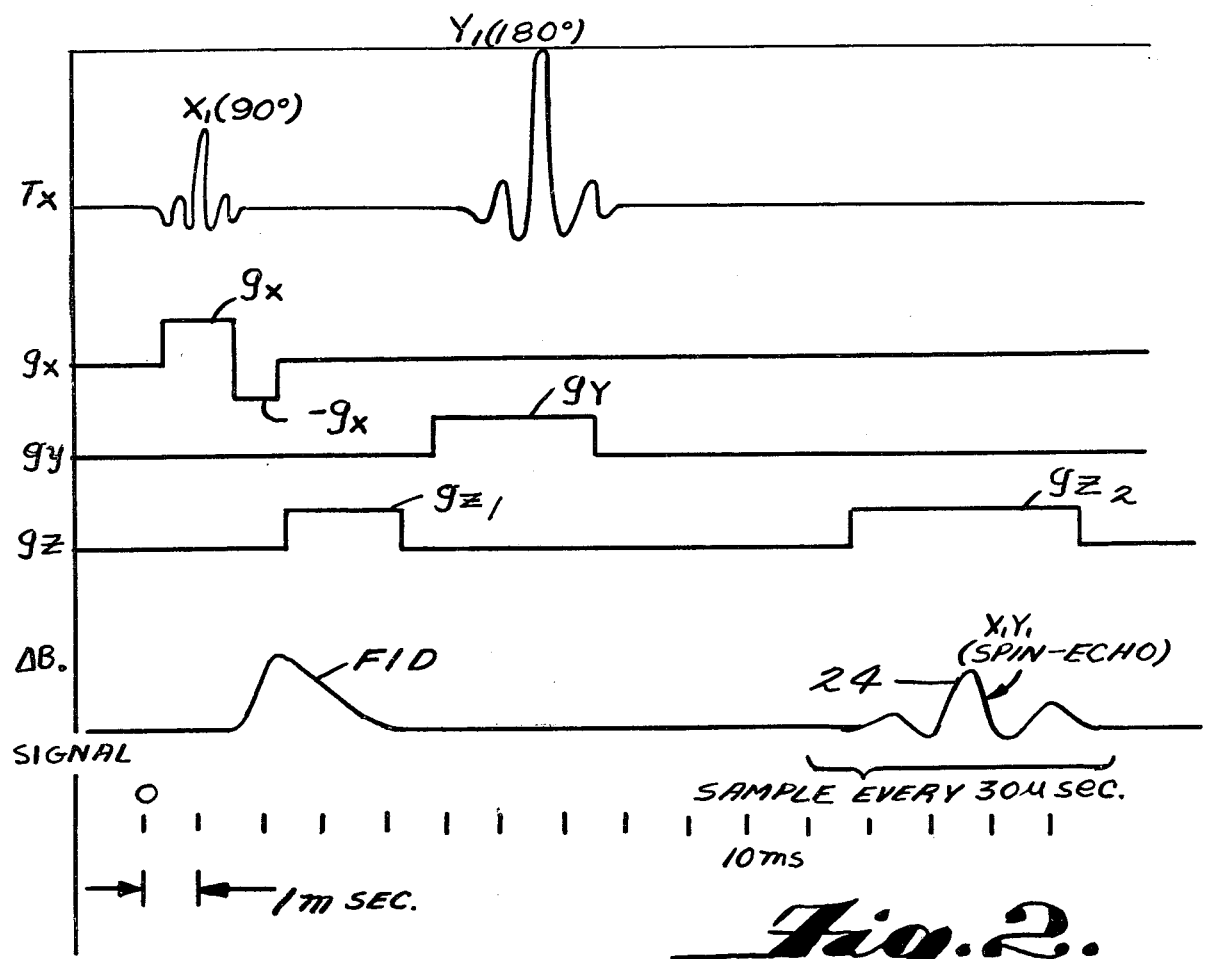
FIG. 2 is a diagram illustrating the selective spin echo sequence of FIG. 1.

Referring now to FIGS. 1 and 2, a spin-echo scanning sequence in accordance with the present invention will be described for determining the normal or $T_1$ modified density of nuclear spins (hereinafter termed the "spin density") in a unit volume 11 within an object 10. Suitable apparatus for practicing such spin-echo scanning sequence will hereinafter be described in conjunction with FIGS. 11, 12 and 13.

The first step in the spin-echo scanning sequence, as in the other NMR imaging techniques, is to provide initial alignment of nuclear spins in object 10. To this end, an intense magnetic field, $B_0$, is generated along, for example, the Z direction of a nominal Cartesian coordinate system centered in alignment with object 10 (FIG. 1A). As noted above, the nuclear spins of the atoms assume Larmor frequencies directly proportional to the magnetic field acting thereon, and tend to align with magnetic field $B_0$.

Next, a particular volume within object 10 is excited to nutate the spins of the atoms in the volume to a transverse orientation, preferably 90°. It should be recalled that nuclei with spins at a given Larmor frequency are responsive only to external electromagnetic signals substantially at the Larmor frequency. Thus, if object 10 is subjected to a position variant magnetic field, such as, for example, a magnetic gradient along the X direction ($g_x = \delta B_z/\delta x$) the nuclei located within the various Y-Z planes (planar volumes) located at different positions along the X axis will have different Larmor frequencies. A single Y-Z plane can thus be addressed by irradiating object 10 (while in the presence of the X position variant field) with an electromagnetic signal having a frequency spectrum corresponding to the particular Larmor frequency of the plane. In practice, of course, the addressed volume of atoms have a finite X dimension, and accordingly, include spins of Larmor frequencies over a predetermined bandwidth.

Thus, after initial alignment of the spins by field $B_0$, an X-variant magnetic field, suitably a gradient $g_x$ (FIG. 2), is generated across object 10, to provide a Larmor frequency discriminant along the X axis. In the presence of the gradient $g_x$, a particular planar volume 12 (FIG. 1B) within object 10 is addressed by irradiating object 10 with a 90° electromagnetic pulse $X_1$ having a frequency spectrum consisting substantially of frequency components corresponding to the Larmor frequencies of the atoms disposed within plane (planar volume) 12.

The relationship of 90° pulse $X_1$ and gradient $g_x$ are shown in FIG. 2. It should be noted that FIG. 2 (and FIG. 5) depicts the presence or absence of the gradient, rather than the shape or form of the gradient itself.

To simplify the following discussion, the following conventions will be adopted. The process of irradiating the object with an electromagnetic signal of predetermined frequency spectrum in the presence of a position variant field to excite a predetermined volume of nuclei will hereinafter be referred to as a process of selective irradiation. Similarly, planar volumes wherein the nuclear pins are reoriented by 90° or 180° will hereinafter be referred to as 90° planes and 180° planes, respectively.

As previously noted, the nuclear spins within volume 12 are, after 90° pulse $X_1$ and Type I phase correction $-g_x$, initially in alignment and at 90° with respect to the original orientation and thus induce a relatively strong voltage in a coil disposed about the X axis. However, the induced voltage decays with time as the phases of the spins at different positions within volume 12 spread. The free induction decay (FID) signal generated by the nuclei within volume 12 as a result of 90° pulse $X_1$ is shown in FIG. 2.

Now a Type IV phase correction is applied by the gradient $g_{z1}$. This gradient is applied to spread the phases along the z direction so that they may be refocused by $g_{z2}$ during the first half of the spin echo read out. $g_{z1}$ has the same area as the first half of $g_{z2}$. FIG. 2 shows $g_{z1}$ not overlapping any other gradient for simplicity in presenting the FID. It is possible to have $g_{z1}$ overlap $-g_x$ with no deleterious effect on the spin echo and a reduction in the time required for the sequence.

The next step in the spin-echo scanning sequence is to effect a 180° rotation of nuclear spins within a volume transverse to volume 12 and intersecting volume 12 such that unit volume 11 is common to both volumes. A Y-position variant magnetic field, suitably a gradient $g_y = \delta B_z/\delta y$ is therefore generated across object 10, and a predetermined X-Z planar volume 14 (FIG. 1C) is excited by a 180° pulse $Y_1$ having a frequency spectrum corresponding to the band of Larmor frequencies of the nuclei within volume 14. Thus, the phases of the spins of the nuclei within volume 14 are reversed and volume 14 becomes a 180° plane.

The effect of the phase reversal on those nuclei common to both planes 12 and 14 (hereinafter referred to as intersection volume 16, FIG. 1D) is to recluster the spin phases. Thus, a spin echo (FIG. 2) is produced by intersection volume 16.

Referring briefly to FIG. 3, it should be noted that 180° pulse $Y_1$, in effect, acts as a mirror with respect to FID 22. As the phases begin to regroup, a reflection of the decay is provided and a peak signal is generated at a time $2\tau$, where $\tau$ is equal to the time between the generation of 90° pulse $X_1$ and 180° pulse $Y_1$, in accordance with the rule of equal times. The phases of the spins thereafter spread and the spin echo decays in a manner similar to the decay of the FID. As will hereinafter be explained, the rule of equal times can be utilized in a multi-line scan system to provide non-interfering spin echoes from the multiple lines. Further, while the spin echo is of less magnitude that the FID due to transverse relaxation ($T_2$) the mirroring effect provides twice the sampling period for collecting the data. As stated above, the $T_2$ relaxation time affects the spin echo signal which is used as an indication of nuclear density. Thus, those skilled in the art refer to a density affected by the $T_2$ relaxation time as the $T_2$ modified density.

The spin echo is recorded in the presence of a position variant magnetic field wherein the intensity of the magnetic field varies as a function of position along the line of intersection. Referring again to FIGS. 1 and 2, the individual spin densities of unit volumes within intersection volume 16 are determined by subjecting object 10 to a Z-position variant magnetic field, suitably gradient $g_z = \delta B_z/\delta z$ (FIG. 2) during the time period when the spin echo 24 is generated. The spin echo signal is sampled and a Fourier transform of the sampled spin echo signal is performed to, in effect, measure the intensity of the various frequency components of the spin echo. The spin density of the particular unit volume 11 is thus represented by the intensity of the spin-echo frequency component corresponding to the particular Larmor frequency of the unit volume.

If the gradient $g_z$ is such that its contribution to $B_z$ is zero at the center of intersection volume 16, unit volumes at equal Z distances on either side of the center will have Larmor frequencies at equal frequency increments above and below the center Larmor frequency. The demodulated signal components from those unit volumes will be at equal and opposite frequencies and can thus be discriminated by conventional quadrature detection techniques, as will be described.

Figure 4:
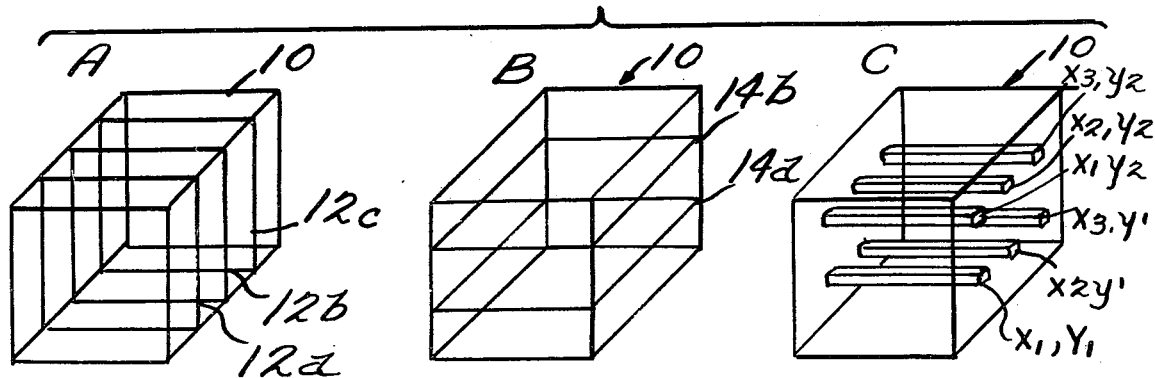
FIGS. 4A–4C are pictorial schematics of an object subjected to a multi-line spin echo scanning sequence.

The spin-echo scanning sequence just described is particularly advantageous in that it is readily adapted for rapid multi-line scanning. By selectively addressing a sequence of respective planes with 90° pulses, then sequentially addressing selected transverse planes with 180° pulses, a timed sequence of spin echoes from plural lines of intersection can be effected. The aforementioned rule of equal times provides a time discriminant between the respective spin echoes. By way of example, a two line sequence will now be explained with reference to FIGS. 4 and 5.

Figure 5:
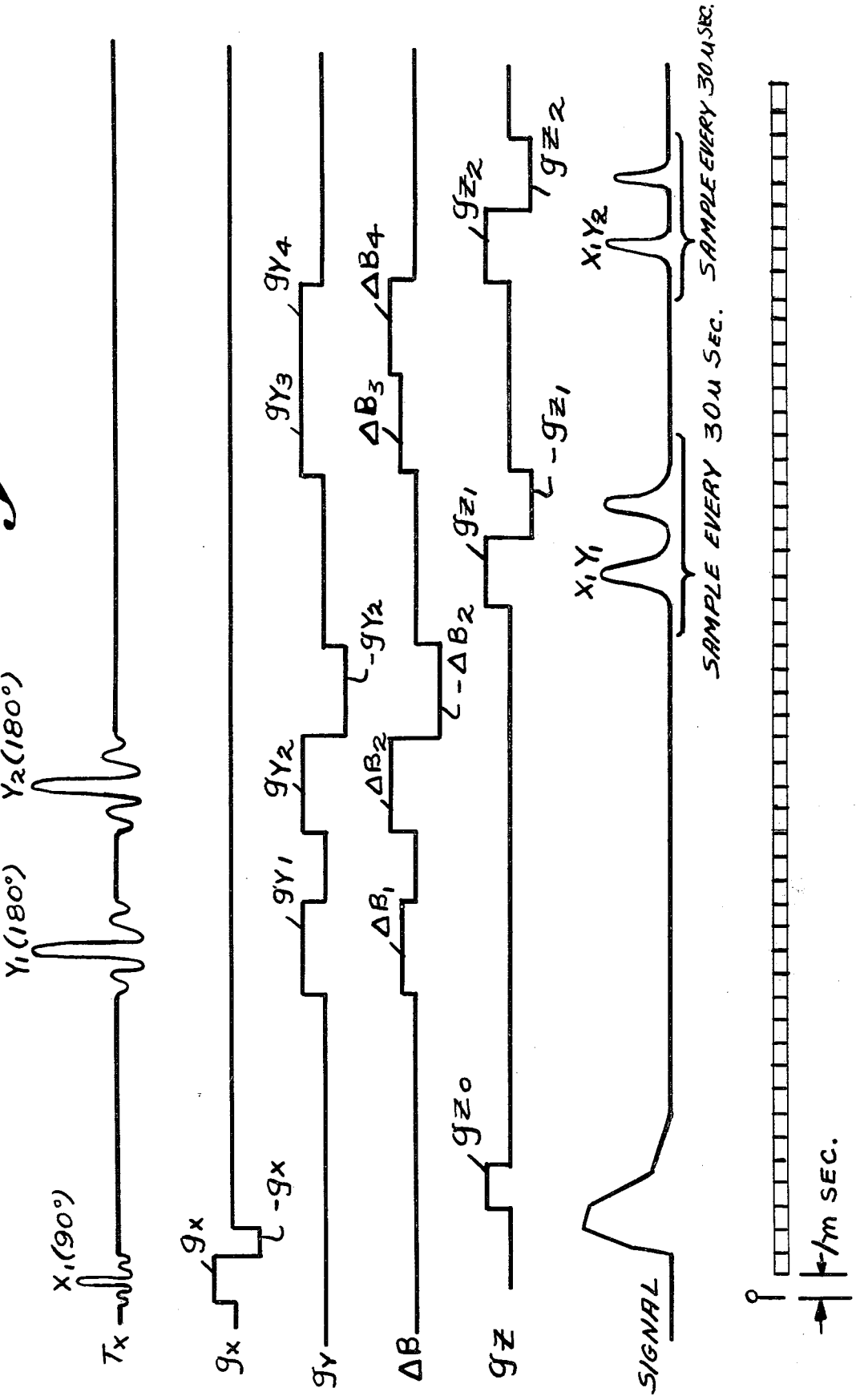
FIG. 5 is a diagram illustrating a two line spin scanning sequence.

As in the single-line scanning sequence, a first plane 12 (FIG. 4A) is addressed by selective irradiation, suitably utilizing a 90° pulse $X_1$ in cooperation with an X-gradient $g_x$ (FIG. 5). Thereafter, successive selective irradiation processes are performed to cause phase reversals in transverse planes 14A and 14B (FIG. 4B). As shown in FIG. 5, a Y-position variant magnetic field, suitably a gradient $g_{y1}$, is generated across object 10 and a 180° pulse $Y_1$ of appropriate frequency spectrum, is applied to selectively excite volume 14A to 180°. A second X-Z plane 14B is excited by a selective irradiation process utilizing a second 180° pulse $Y_2$ and Y-gradient $g_{y2}$ in predetermined time relation with pulses $X_1$ and $Y_1$. X-Z plane 14B is selected at a Y position different from that of plane 14A by suitably offsetting the frequency spectrum of 180° pulse $Y_2$ by a suitable frequency $\Delta F$, changing the main magnetic field $B_0$ by a predetermined amount $\Delta B$ (the shift $\Delta B$ effecting a shift in relative Larmor frequency throughout the object) or by combination of both. The $\Delta B$ method is schematically illustrated in FIG. 5.

The nuclei common to both the 90° plane and 180°0 plane, i.e., intersection volumes $X_1Y_1$ and $X_1Y_2$ (FIG. 4C) generate respective spin echoes (also designated $X_1Y_1$ and $X_1Y_2$ in FIG. 5) at respective times in accordance with the rule of equal times. The respective spin echoes are recorded in the presence of position variant magnetic fields, gradients $g_{z1}$ and $g_{z2}$ (FIG. 5), respectively, to impart a Larmor frequency discriminant along the line of intersection. Fourier transforms are taken of the recorded spin echoes to develop indicia of the spin-densities or $T_1$ modified spin densitites of unit volumes within the intersection volumes.

It should be noted that the respective spin echoes $X_1Y_1$ and $X_1Y_2$ occur at time periods after pulse $Y_1$ and after $Y_2$, respectively, equal to the time periods between pulses $Y_1$ and $X_1$ and pulses $Y_2$ and $X_1$. Thus, by proper relative timing of pulses $Y_1$ and $Y_2$ spin echoes $X_1Y_1$ and $X_1Y_2$ can be made to occur with a desired time interval there between to provide proper discrimination between lines.

The spin phases of nuclei other than in the respective instantaneously selected planes are spread by exposure to the respective magnetic gradients. Spurious phase spreading due to the gradients and steps in magnetic field $\Delta B$ is corrected by application of the various types of phase corrections. For example, with reference to FIG. 5, gradient $-g_x$ is the Type I phase correction required following a 90° selective irradiation. The gradient $g_{y1}$ causes phase spreading in 180° plane 14B prior to pulse $Y_2$ and gradient $g_{y2}$ causes phase spreading in 180° plane 14A after pulse $Y_1$. Correction should be made for such spurious phase spreading prior to the generation of a spin echo signal from nuclei within the affected plane. Accordingly, to avoid errors due to spurious phase spreading in spin echo $X_1Y_1$ a (Type II) negative gradient $-g_{y2}$ is applied immediately upon termination of gradient $g_{y2}$. However, negative gradient $-g_{y2}$ affects plane 14B after pulse $Y_2$ and must itself be corrected. Correction for the effects of gradients $g_{y1}$ and $-g_{y2}$ on plane 14B and thus echo $X_1Y_2$ is provided by application of Type IV correction gradient $g_{y3}$ and gradient correction Type III $g_{y4}$, respectively. The first half of read out gradient $g_{z1}$ must refocus spin phases to produce an echo. This requires that the spins be defocused at the start of the sequence. Gradient $g_{z0}$ does this. The area of gradient $g_{z0}$ is half that of $g_{z1}$ such that the refocusing is comlete at the center of the echo. The first half of $g_{z1}$ is, in effect, a Type IV phase correction for $g_{z0}$. $G_{z0}$ may be applied at the same time as $-g_x$.

Phase spreading effects of the second half of gradient $g_{z1}$ on plane 14B are corrected by application of negative gradient $-g_{z1}$ (a Type II phase correction). The spin echo is refocused during this correction and samples taken during this period can be used in signal averaging.

Figure 6:
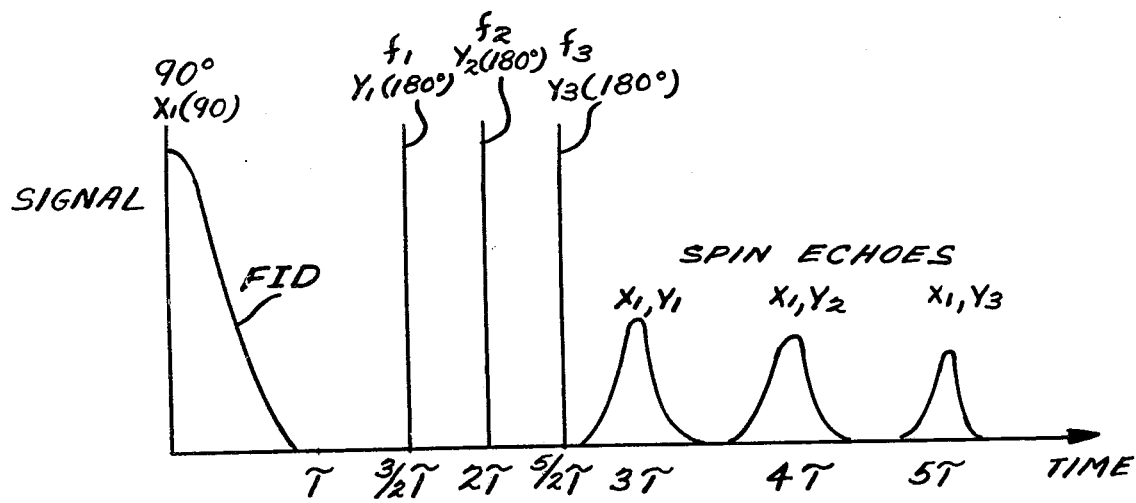
FIGS. 6 and 7 are schematic graphs of further multi-line spin echo sequences in accordance with the present invention.

FIG. 6 schematically illustrates a three line spin-echo scanning sequence. A 90° pulse $X_1$ is applied at time $t_0$ (in the presence of an X gradient) and a sequence of Y pulses (in the presence of Y gradients) irradiate the object of times $3\tau/2, 2\tau$ and $5\tau/2$, respectively. Accordingly, a spin echo $X_1Y_1$ is generated at a time $3\tau$ by the nuclei disposed common to both the 90° plane associated with pulse $X_7$ and the 180° plane associated with pulse $Y_1$. Similarly, spin echoes $X_1Y_2$ and $X_1Y_3$ are generated by the nuclei common to the planes associated with pulses $X_1$ and $Y_2$, and pulses $X_1$ and $Y_3$, at times $4\tau$ and $5\tau$, respectively. Phase correction (not shown) can be effected in a manner similar to that described in conjunction with FIG. 5. The spin echoes are recorded in the presence of a Z gradient and Fourier transforms performed to develop indicia of the relative normal or $T_1$ modified spin densities.

Figure 7:
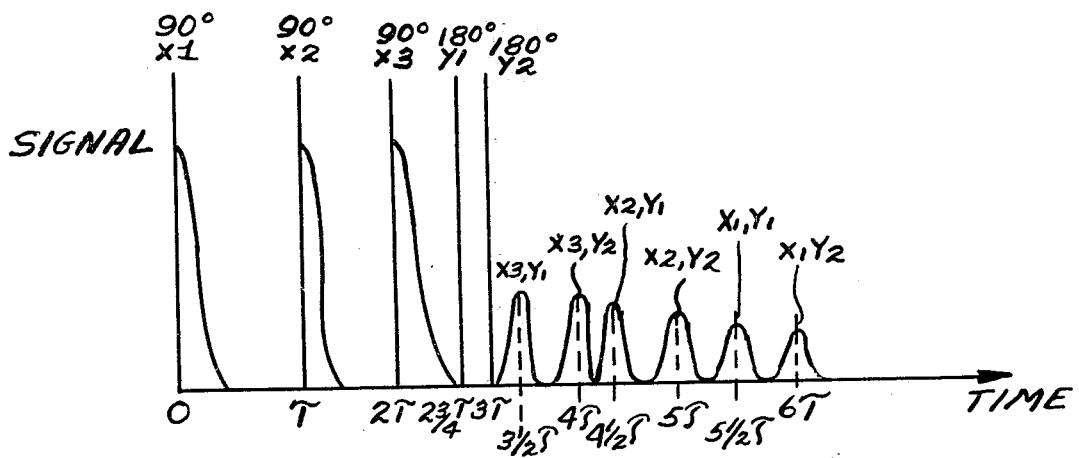

As schematically illustrated in FIG. 7, a plurality of Y-Z planes can be sequentially excited in cooperation with one or more X-Z planes to produce a multi-line scan. For example, assume Y-Z planes 12A, 12B and 12C (FIG. 4A) are excited to 90° orientations by a selective irradiation process including irradiation of the object by successive 90° pulses $X_1$, $X_2$ and $X_3$ in the presence of X gradients. As noted above, the planes along the X axis (and Y axis) are uniquely selected by choosing appropriate frequency spectrums for the respective 90° pulses, by offsetting the magnetic field $B_0$, or by a combination of both techniques. After Y-Z planes 12A, 12B and 12C are excited to 90°, selected X-Z planes 14A and 14B are excited to 180° by a similar process of selective irradiation utilizing 180° pulses $Y_1$ and $Y_2$. The intersections of the respective Y-Z planes and X-Z planes result in a plurality of lines of intersection as shown in FIGS. 4C, $X_1Y_1$, $X_2Y_1$, $X_3Y_1$, $X_1Y_2$, $X_2Y_2$ and $X_3Y_2$. Each such line of intersection generates a spin echo signal denoted in FIG. 7 by the respective associated line of intersection in accordance with the aforementioned rule of equal times.

By proper choice of the time intervals between respective pulses, the respective spin echoes are generated in a non-interfering sequence. For example, assuming 90° pulses $X_1, X_2,$ and $X_3$ to be generated at times 0, $\tau$ and 2$\tau$, respectively, and 180° pulses $Y_1$ and $Y_2$ generated at $11\tau/4$ and $3\tau$, respectively, the spin echo from the line of intersection $X_3Y_1$ will be generated at time $3\tau/2$; $X_3Y_2$ at time $4\tau$; $X_2Y_1$ at $9\tau/2$; $X_2Y_2$ at $5\tau$; $X_1Y_1$ at $11\tau/2$; and $X_1Y_2$ at $6\tau$. Correction for phase spreading due to the effects of the respective gradients would again be made in a manner similar to that described above with respect to FIG. 5. The respective spin echoes are then recorded in the presence of a Z gradient and Fourier transforms performed to develop indicia of the normal or $T_1$ modified spin densities of the individual unit volumes within the lines of intersection. Thus, utilizing a spin echo sequence in accordance with the present invention, a multiplicity of lines within volume 10 can be scanned in rapid sequence, at rates not limited by the spin-lattice relaxation time $T_1$ of the object as in scanning techniques using saturation.

Figure 8:
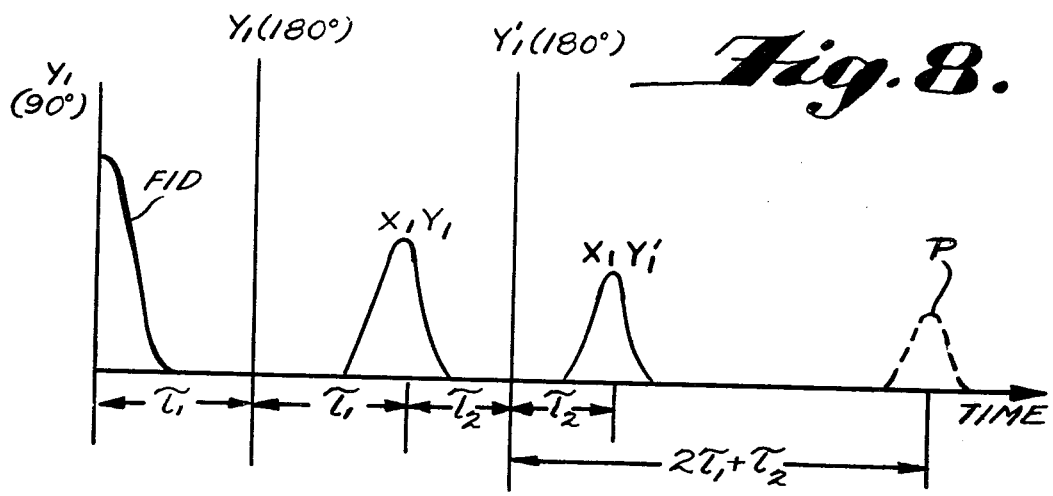
FIGS. 8, 9 and 10 are schematic graphs illustrating spin echo scanning sequence in accordance with the present invention, employing copying.

In some instances, it is desirable to take plural readings of the spin echo from a given line of intersection for signal averaging purposes. As noted above, Mansfield and Maudsley have indicated that after the FID has decayed, various signal refocusing arrangements can be employed to recall the signal for signal averaging purposes. A similar process may be employed to recall the spin echo signal. Referring now to FIG. 8, a spin echo $X_1Y_1$ is generated by first selectively irradiating a first plane (planar volume) with a 90° pulse $X_1$, and thereafter selectively irradiating a transverse plane with a 180° pulse $Y_1$. Assuming the time interval between pulse $X_1$ and $Y_1$ to be equal to $\tau_1$, spin echo $X_1Y_1$ is generated with a peak at a time $\tau_1$ after the irradiation of 180° pulse $Y_1$, in accordance with the rule of equal times. If a further 180° pulse $Y_1'$ having a frequency spectrum including that of pulse $Y_1$ is generated at a time $\tau_2$ after the peak of spin echo $X_1Y_1$, the phases of the nuclear spins generating spin echo $X_1Y_1$ will be reversed, causing the phase to converge and thereby create a copy or replica $X_1Y_1'$ of spin echo $X_1Y_1$.

The rule of equal times applies to the phenomenon of copying. Accordingly, replica $X_1Y_1'$ occurs at a time $\tau_2$ after the generation of 180° pulse $Y_1'$. Further replicas can be generated by applications of additional 180° pulses. However, the overall amplitudes of the signals decrease in accordance with the transverse relaxation time $T_2$. Such decay represents a practical limit on the number of replicas that can be produced.

It should be appreciated that if 180° pulse $Y_1'$ includes spectral components not in pulse $Y_1$, a phase reversal will be effected of portions of the original 90° plane not affected by pulse $Y_1$. Thus, such portions of the original 90° plane will produce a parasitic spin echo P at a time $2\tau_1 + \tau_2$ after the generation of pulse $Y_1'$. The parasitic echo P can be avoided by making the frequency spectrum at 180° pulse $Y_1'$ identical to that of pulse $Y_1$.

Figure 9:
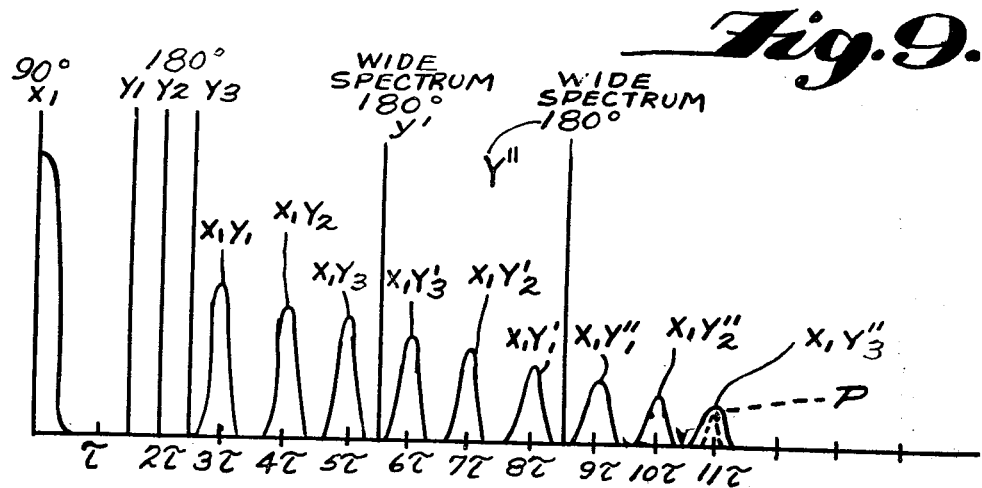
Figure 10:
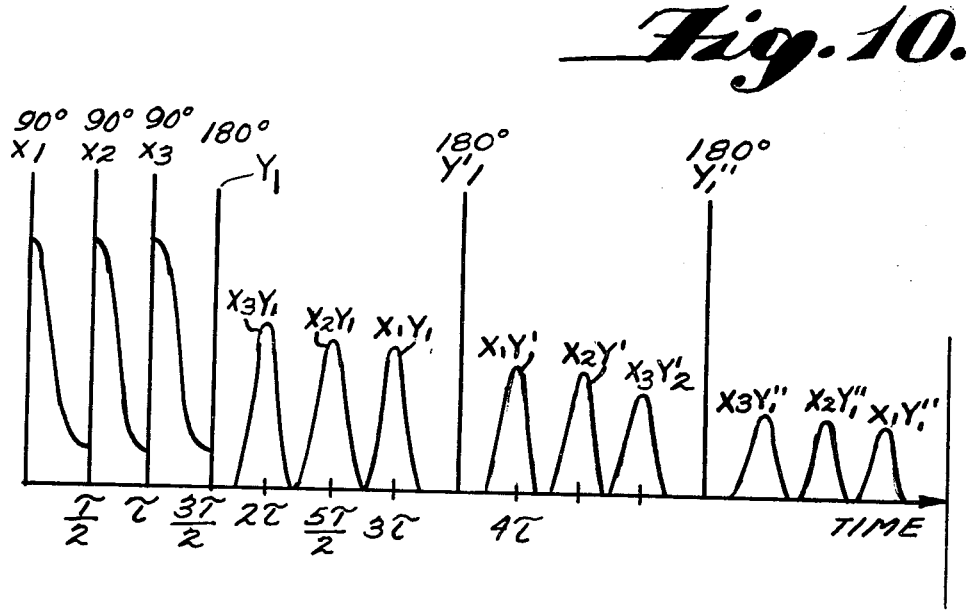

Replicas of a plurality of spin echoes can be generated by application of a single 180° pulse having a frequency spectrum encompassing the individual frequency spectra of the original 180° pulses, i.e., covering the respective 180° planes. Such a procedure is schematically illustrated in FIGS. 9 and 10. In FIG. 9, a first plane is selectively irradiated by 90° pulse $X_1$, then respective transverse planes are selectively irradiated in sequence by 180° pulses $Y_1$, $Y_2$, and $Y_3$, respectively, applied at times $3\tau/2$, $2\tau$ and $5\tau/2$. Accordingly, spin echoes from the respective lines of intersection $X_1Y_1$, $X_1Y_2$ and $X_1Y_3$ are generated at times $3\tau$, $4\tau$ and $5\tau$, respectively.

Application of a wide spectrum 180° pulse Y' at, for example, time $11\tau/2$, will generate replicas of the spin echoes in reverse order. In accordance with the rule of equal times, replica $X_1Y_3'$ is generated at a time $6\tau(\frac{1}{2}\tau$ after the application of pulse Y', an interval equal to the time between the occurrence of spin echo $X_1Y_3$ at $5\tau$ and pulse Y'). Similarly, replica $X_1Y_2'$ occurs at time $7\tau$ and replica $X_1Y_1'$ occurs at time $8\tau$.

Application of a second wide spectrum 180° pulse Y''' at, for example, time $17\tau/2$ will create further replicas of the spin echoes, this time in the same order as the original spin echoes. Replicas $X_1Y_1''$, $X_1Y_2''$ and $X_1Y_3''$, respectively, occur at times $9\tau$, $10\tau$ and $11\tau$.

It should be noted, however, that wide spectrum 180° pulse Y' causes phase reversals in portions of the 90° plane not phase reversed by pulse $Y_1$, and accordingly, a parasitic spin echo P is generated. In accordance with the rule of equal times, such parasitic echo is generated at a time $11\tau$. Thus, parasitic echo P renders replica $Y_3X_1'$ substantially useless.

The parasitic echo can be reduced by reducing the portions of the 90° plane not phase reversed by pulse $Y_1$. The effects of the parasitic echoes can also be lessened or spread between various of the replicas by changing the relative timings of wide spectrum 180° pulses Y' and Y'''.

FIG. 10 shows an alternate spin echo scanning sequence utilizing copying. In this instance, a plurality of 90° planes are generated by selective irradiation with respective 90° pulses $X_1$, $X_2$ and $X_3$, followed by a 180° pulse $Y_1$ of predetermined frequency spectrum. The resultant lines of intersection generate respective spin echoes $X_3Y_1$, $X_2Y_1$, and $X_1Y_1$ in accordance with the rule of equal times. Thereafter copying is effected by selective irradiation employing respective 180° pulses $Y_1'$ and $Y_1''$ of identical frequency spectrum to pulse $Y_1$. It should be appreciated that since the frequency spectrum of the respective 180° pulses are identical, no parasitic echoes are generated.

Figure 11A:
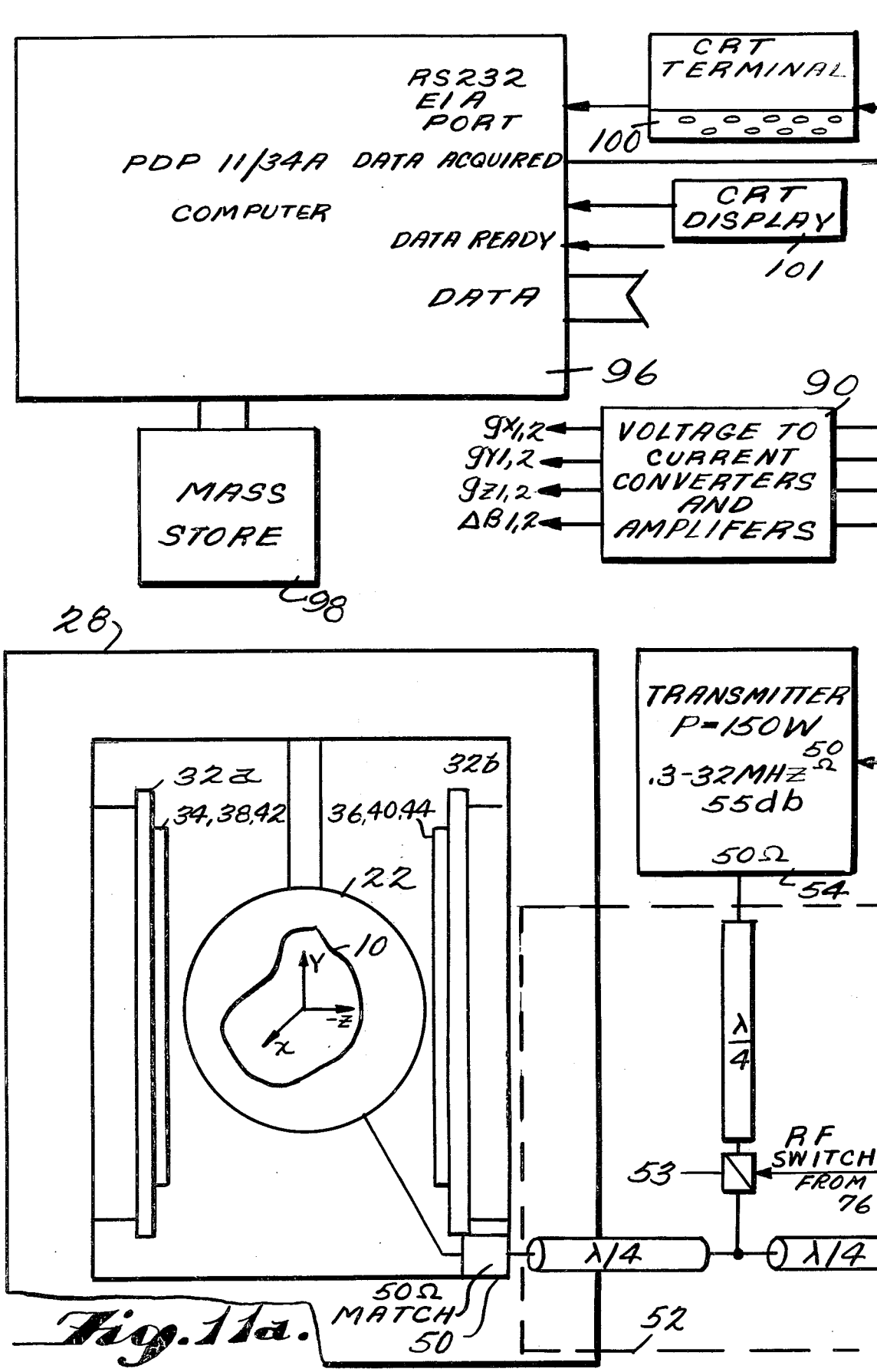
FIG. 11 is a schematic block diagram of an apparatus for effecting spin echo scanning sequences in accordance with the present invention.
Figure 11B:
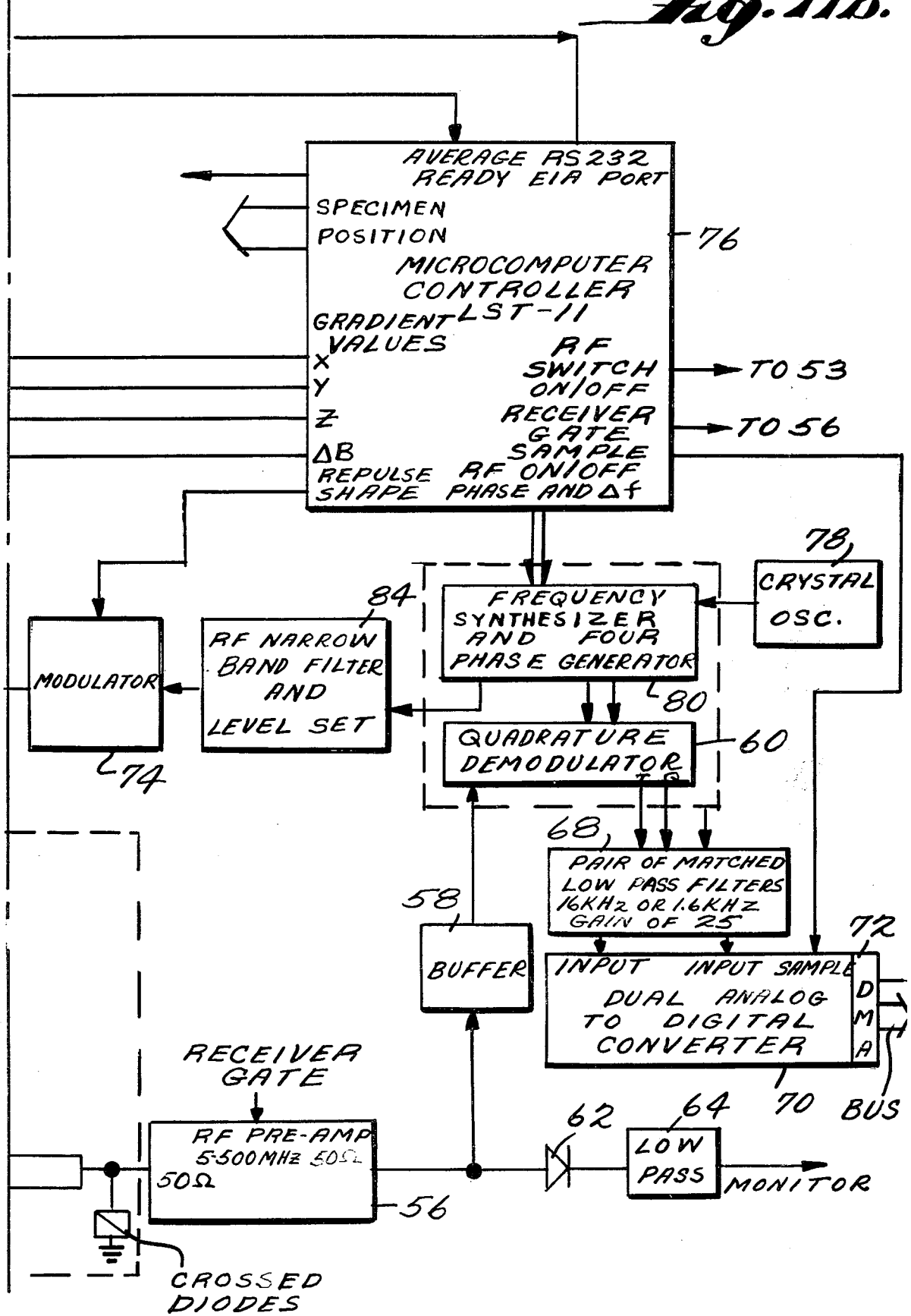

Referring now to FIGS. 11 and 12, suitable apparatus for effecting spin-echo scanning sequences in accordance with the present invention will be described. FIG. 11 shows the overall apparatus in block schematic form, while apparatus utilized in generating the various magnetic fields (control circuitry excepted) is shown in exploded perspective in FIG. 12.

Object 10 is disposed within an RF coil 22 disposed about the nominal X axis of a Cartesian coordinate system. RF coil 22 is utilized in irradiation of object 10, to pick up the spin echo signals generated by object 10 and, further, suitably provides a support holder for the object 10.

Coil 22 is, in turn, disposed between respective pole tips 24 and 26 of main magnet 28. Magnet 28 is utilized to generate the main magnetic field $B_0$ along the Z-direction of the nominal coordinate system (transverse to the axis of coil 22). Magnet 28 suitably comprises a conventional iron core having wound thereabout, copper conductors cooperating with a power supply (not shown) and are suitably water cooled to maintain a constant temperature.

Z-position variant fields are selectively provided by Z gradient coils ($g_z$) 34 and 36. Coils 34 and 36 are disposed on the respective faces of pole tips 24 and 26 and are suitably in a Maxwell coil geometry. That is, the coils are circular and concentric with the pole tip with the radius of the coils determined in accordance with the separation of the coils. Z gradient coils 34 and 36 are electrically connected in series such that the magnetic fields generated thereby are in opposition and cancel at the origin of the coordinate system.

X-position gradient magnetic fields are selectively provided by X gradient ($g_x$) coils 38 and 40. Coils 38 and 40 are suitably of a rectangular configuration disposed on pole tips 24 and 26, respectively, so as to simulate infinite conductors running in an X direction. Coils 38 and 40 are electrically connected to generate opposing magnetic fields which also cancel at the origin of the coordinate system.

Y-position variant magnetic fields are selectively provided by Y gradient ($g_y$) coils 42 and 44. Coils 42 and 44 are suitably of the same shape and area as X gradient coils 38 and 40 but are disposed on pole tips 24 and 26 in a manner to simulate infinite conductors running in the Y direction. Coils 42 and 44 are also electrically connected to generate opposing fields which cancel at the origin of the coordinate system.

Position-independent changes in main field $B_0$ can be effected, if desired, by $\Delta B$ coils 32A and 32B, disposed about the outside of pole tips 24 and 26 and electrically connected in series such that they provide an additive magnetic field (with respect to each other). For further description of suitable coils for producing magnetic gradients reference is made to the aforementioned U.S. Pat. No. 4,015,196 issued Mar. 29, 1977 to Moore et al.

RF coil 22 is electrically connected through an appropriate matching impedance network 50 to one terminal of a directional network or circulator (magic-T network) 52. Impedance matching network 50 suitably comprises a pair of variable capacitors for tuning RF coil 22. The variable capacitors are suitably of a non-magnetic material such as copper or brass and preferably are situated as closely as possible to RF coil 22.

Magic-T network 52 selectively couples RF coil 22 (in a mutually exclusive manner) to transmitter 54 and to a preamplifier 56. As is well known in the art, magic-T network 52 operates to connect transmitter 54 to the coil during such times that transmitter 54 is transmitting, and connects coil 22 to preamplifier 56 during such periods when transmitter 54 is not transmitting.

Preamplifier 56 is suitably of conventional type, providing a high gain and wide bandwidth. It is desirable to switch the preamplifier off during transmission or interim periods to provide greater isolation from transmitter 54. Accordingly, a gated preamplifier can be utilized. The output signals from preamplifier 56 are applied through diode detector 62 and lowpass filter 64, if desired, for monitoring during tuning of the system, and are applied through a buffer 58 to a demodulator 60.

Demodulator 60 is suitably a quadrature demodulator, so that not only frequency offset (from the center frequency, as will be explained) and amplitude information is provided, but the sign of the frequency offset can be determined as well, for relating the respective frequency components to positions in object 10 on opposite sides of the origin. Further, use of quadrature demodulator avoids phase errors due to circuit delays. Demodulator 60 is receptive of signals indicative of the transmitted signal (as well as the received signal), and generates inphase (I) and quadrature (Q) output signals (the Q output signal being at 90° phase relative to the I output signal). The I and Q output signals include components indicative of the sum and difference of the received signal frequency and the transmitted signal frequency. The spin echo signal (minus the carrier frequency) is recovered by developing the square root of the sum of the square of the I and Q signals. A more detailed description of a suitable demodulator 60 will be made in conjunction with FIG. 13.

The I and Q demodulator output signals are applied through respective lowpass filters 68, to a two channel analog-to-digital converter (A/D) 70. A/D converter 70 is, in turn, connected through a direct memory access (DMA) interface 72 to a suitable computer 96.

Transmitter 54 is suitably a class A amplifier having bandwidth sufficient to cover a desired bandwidth of Larmor frequencies, and is driven by signals from a modulator 74. Modulator 74 suitably comprises a balanced mixer (filtered) and is receptive of a pulse shape control signal from suitable microcomputer control 76 (as will be hereinafter described) and a signal at a desired Larmor carrier (center) frequency.

The Larmor carrier frequency signal is suitably developed from the output signal of a crystal oscillator 78 by a frequency synthesizer/phase generator 80 in phase locked relationship with crystal 78 and suitable bandpass filter and level setting circuitry 84. Bandpass filter 84 operates to develop a sine wave with a predetermined constant envelope from the output of frequency synthesizer 80. A more detailed description of a suitable frequency synthesizer/phase generator 80 will be hereinafter provided in conjunction with FIG. 13. The generation of the Larmor center frequency signal is performed responsive to control signals from microcomputer controller 76.

Microcomputer Controller 76, in essence, controls the sequence of events within the NMR system: the interfacing of a computer 96 with the system, display of data such as by a CRT terminal 100, the generation of field gradients, and the timing, amplitude, frequency and phase of transmitted electromagnetic signals. Microcomputer controller 76 is suitably based on a microcomputer such as an LSI-11. A microcomputer such as the LSI-11 can be modified for more rapid operation (for example, with respect to turning on or off the carrier signal, selection of gradient direction and selection of phase) by addition of special purpose hardwired interface circuits. Reference is made to "An NMR Sequencer for Imaging," by J. Hoenninger and L. Crooks in press.

In effecting generation of the magnetic field gradients, microcomputer controller 76 generates respective control signals indicative of desired gradient values and particular gradient directions. A similar control signal indicative of particular values of $\Delta B$ and/or $\Delta f$ are generated, if desired. The gradient value control signals, and/or the $\Delta B$ signal, are applied to conventional voltage-to-current converters and amplifiers 90 which, in turn, apply the gradient signals to the appropriate ($g_z$) coils 34, 36; ($g_x$) coils 38, 40; and ($g_y$) coils 42, 44 and applies the $\Delta B$ signals to coils 32A and 32B.

Microcomputer controller 76 provides control signals representative of the desired RF pulse shape to modulator 74 to thus set the amplitude and duration of the electromagnetic signals and, accordingly, the spin reorientation (nutation) angle, e.g., 90°, 180°, effected by the signal. The desired electromagnetic pulse shape and amplitude scale factor are maintained in memory and selectively utilized to develop the control signals.

In the selective irradiation process, it is desirable that the electromagnetic pulses have a narrow band frequency spectrum. Accordingly, a (sin t)/t pulse shape is utilized (which provides an almost square frequency spectrum). A Gaussian pulse shape (which provides a Gaussian frequency spectrum) has also been considered.

Microcomputer controller 76 also suitably includes provisions for controlling sampling by A/D converter 70 and for controlling transmission of data from DMA interface 72 to computer 96. Responsive to signals from microcompouter controller 76, A/D converter 70 takes a predetermined number of samples of the demodulated signals, and transmits the data to main computer 96 (memory 98) through DMA 72. When a group of samples is received by main computer 96, they are stored in the appropriate locations in memory 98. The programming of microcomputer controller 76 and main computer 96 are coordinated such that the data received from DMA 72 can be properly interpreted with respect to sequence. Thereafter a Fourier transform of the data is performed and the Fourier transform of respective line scans are displayed on CRT display 101. If desired, provisions can be made for controlling servomechanisms for positioning the specimen (object 10) with respect to the various coils.

Figure 13:
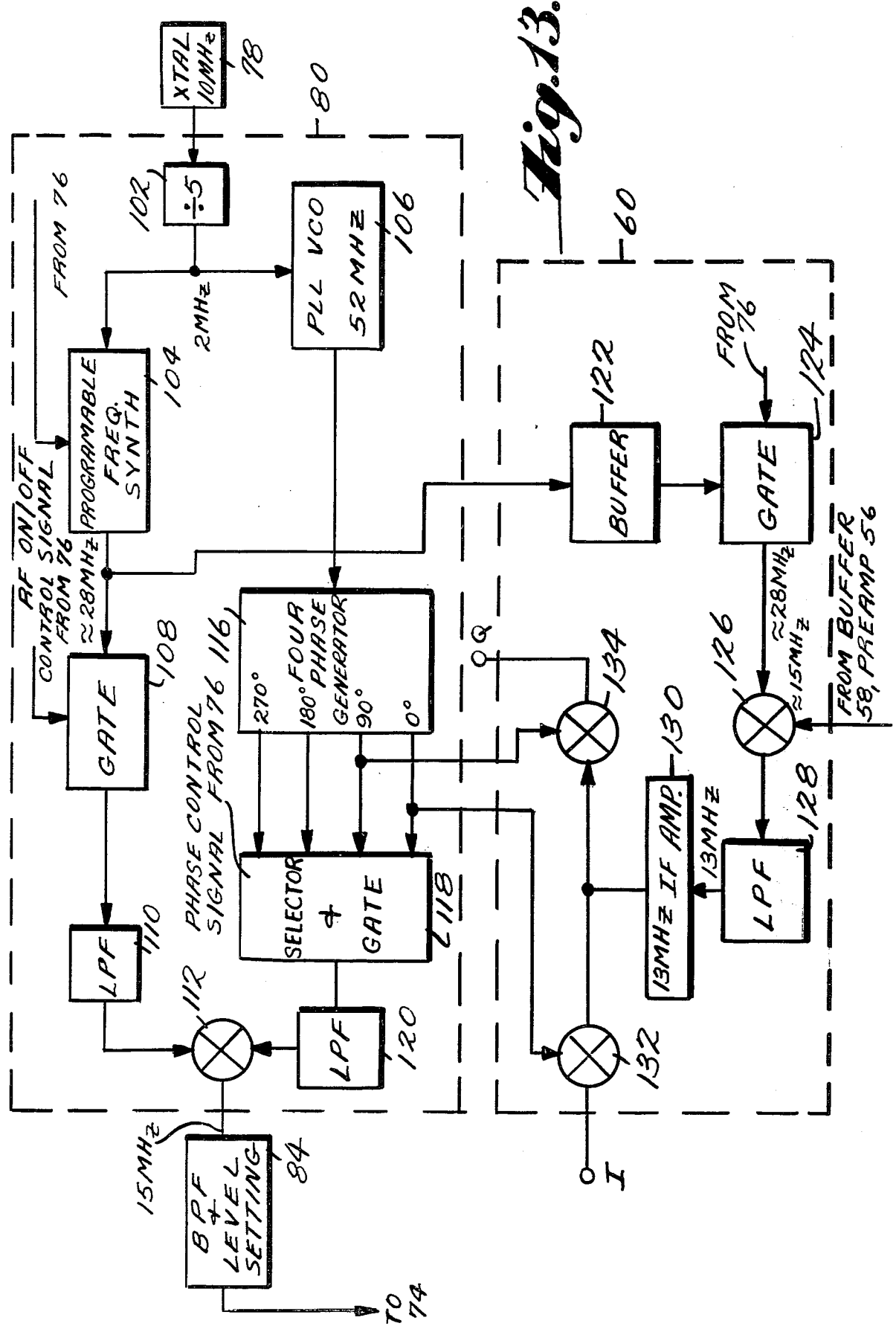
FIG. 13 is a schematic block diagram of the demodulator and frequency synthesizer/phase generator elements of FIG. 11.

With reference now to FIG. 13, a more detailed description of a suitable quadrature demodulator 60 and a suitable frequency synthesizer/phase generator 80 will be provided. To minimize leakage, frequency synthesizer/phase generator 80 and demodulator 60 suitably operate primarily with intermediate frequencies other than the frequency actually transmitted by transmitter 54 and received by preamplifier 56. In this regard, reference is made to U.S. Pat. No. 3,651,396 issued Mar. 21, 1972 to Hewitt et al. Accordingly, crystal oscillator 78 provides a squarewave output signal of predetermined frequency (10 MHz) to frequency synthesizer/phase generator 80. Assuming the desired Larmor frequency to be on the order of 15 MHz, the 10 MHz oscillator signal is then suitably applied to a frequency divider 102 ($\div 5$), to develop a 2 MHz signal. The 2 MHz signal is suitably applied to a programmable frequency synthesizer 104 to a phase locked loop 106. Programmable frequency synthesizer 104 is receptive of control signals indicative of the desired frequency output from microcomputer controller 76. The output signal of frequency synthesizer 104 is applied through a gate 108, under the control of microcomputer controller 76 and lowpass filter 110, to a conventional balanced mixer 112.

Phase locked loop 106 suitably includes a voltage controlled oscillator operating about a predetermined center frequency such as 52 MHz, phase locked to the 2 MHz signal. The 52 MHz output signal of phase locked loop 106 is suitably applied to a conventional four phase generator 116 providing signals at the 13 MHz intermediate frequency with relative phases of 0°, 90°, 180°, and 270°. The output signals of phase generator 116 are applied to suitable selector gating circuitry 118, responsive to control signals from microcomputer controller 76. The selected intermediate frequency signal is passed through a low pass filter 120 to mixer 112 to develop a difference signal component at the desired Larmor carrier frequency.

Assuming the desired frequency to be 15 MHz, programmable frequency synthesizer 104 is set by microcomputer controller 76 to provide a 28 MHz signal, whereby the difference component produced by modulator 112 (28 MHz–13 MHz) is at the desired 15 MHz frequency. The difference component is extracted by bandpass filter and level setting circuitry 84 to produce a sinewave of constant envelope at the desired Larmor carrier frequency.

The output of programmable frequency synthesizer 104 is also applied to a buffer amplifier 122 in demodulator 60. The buffered signal is applied through a gate 124 (under the control of microcomputer controller 76 to a balanced mixer 126. Mixer 126 is also receptive of the received signal as amplified by preamp 56 and buffer 58. In the example wherein the transmitted carrier frequency is 15 MHz, and the synthesizer output 28 MHz, the difference component of the output signal of mixer 126 will be at the intermediate frequency 13 MHz. The difference component is extracted from the mixer output signal by a lowpass filter 128 and is applied to a suitable IF amplifier 130 tuned to 13 MHz. The output signals from IF amplifier 130 are applied to respective balanced mixers 132 and 134. Mixers 132 and 134 are respectively receptive of the 0° and 90° phase intermediate signals from phase generator 116 in frequency synthesizer/phase generator 80. Thus, mixers 132 and 134 respectively provide in-phase and quadrature audio frequency signal indicative of the respective magnetization components of the spin echo signal.

As noted above, the I and Q output signals are filtered and sampled, then stored in memory 98 of computer 96. Computer 96, in effect, computes the vector sum of the I and Q components and performs a Fourier transform on the vector sum to develop indicia of the indicative amplitudes of the respective frequency components of the spin echo signals.

It should be appreciated that since demodulator 60 and frequency synthesizer/phase generator 80 operate primarily at intermediate frequencies other than the Larmor carrier frequency, leakage from the transmitter into demodulator 60 is substantially reduced.

By way of example, the operation of the apparatus of FIGS. 11, 12 and 13 during a single line scan will be described. The particular desired sequences of selective irradiations is entered (or recalled from memory) and the sequence initiated upon a ready signal from main computer 96 to microcomputer controller 76. Main magnet 28 is activated to bring the nuclear spins into initial alignment.

Microcomputer controller 76 computes or recalls from memory or a lookup table, the pulse shape, amplitudes and durations necessary to effect 90° and 180° spin nutations, the desired respective time intervals between pulses and the desired values of the gradients.

Appropriate control signals are generated to selectively irradiate a particular volume (Y-Z plane 12, FIG. 10) with a 90° pulse. An appropriate signal is applied to $g_x$ coils 38 and 40 to develop an X gradient across object 10. An RF pulse shape signal of appropriate amplitude and duration to effect the desired rotational angle (i.e., 90°) is generated and applied to modulator 74.

Simultaneously, appropriate control signals are applied to frequency synthesizer/phase generator 80 to effect generation of a carrier signal at the Larmor frequency associated with plane 12. Programmable frequency synthesizer 104 (FIG. 13) is loaded with an appropriate frequency code from microcomputer controller 76, and a signal generation mode initiated.

For purposes of signal averaging it is sometimes desirable to selectively nutate the spins by the chosen angle (90°, 180°) in different directions (e.g., rotate spins toward Y or −Y axes or X or −X axes). Accordingly, micrcomputer controller 76 also generates an appropriate control signal to selector gate 118 of frequency synthesizer/phase generator 80 (FIG. 13) to pass the appropriately phased IF signal to mixer 112 so that the carrier signal is of such a phase that the transmitted electromagnetic pulse effects rotation in the desired direction. Gate 108 (FIG. 13) is then closed to apply the carrier frequency signal to modulator 74.

Modulator 74 thus applies a shaped RF pulse, at the desired Larmor frequency (and phase) to transmitter 54. Transmitter 54, accordingly, generates a signal through T network 52, RF switch 53 and 50 ohm matching network 50 to RF coil 22 and thereby irradiates object 10. Thus, Y-Z plane 12 in object 10 is excited to 90° by a process of selective irradiation.

Microcomputer controller 76 then generates appropriate gradient control signals of opposite polarity for a predetermined period, to generate a negative gradient for phase correction and then removes the gradient control signal from the $g_x$ coils 38, 40 and thereby turns off the X gradient.

An appropriate signal is applied to $g_z$ coils 34 and 36 to develop a Z gradient across object 10. After a predetermined time these signals are removed thereby turning off the Z gradient. The timing of these events may be modified so that the Z gradient is applied for a time which overlaps the time during which the X gradient used for phase correction is applied.

Appropriate control signals are then generated to effect selective irradiation of X-Z plane 14 (FIG. 1C) by a 180° pulse. An RF pulse shape signal of amplitude and duration corresponding to a 180° rotational angle is applied to modulator 74 and appropriate control signals generated to frequency synthesizer 104 and phase selector 116 to set the frequency and phase of the carrier signal respectively. Gate 108 is enabled and the modulated signal (180° pulse) transmitted into the coil to effect the selective irradiation of plane 14. Simultaneously an appropriate signal is applied to $g_y$ coils 42 and 44 to develop a Y gradient across object 10. After the appropriate time duration has elapsed the transmitter and gradient are turned off via gate 103 and the gradient value output of microcomputer controller 76.

After a time period in accordance with the rule of equal times, the line of intersection 16 (FIG. 1D) of the transverse planes (12 and 14) generates a spin echo. At a time just prior to the expected generation of the spin echo, appropriate control signals are used to apply a gradient value signal to $g_z$ coils 34 and 36, and thus develop a Z gradient across object 10. Gate 124 is enabled to, in effect, turn on the demodulator.

The spin echo signals are induced in coil 22 and are applied through T network 52 to preamplifier 56 and thereafter through buffer 58 to quadrature demodulator 60. Quadrature demodulator 60 in cooperation with lowpass filter 68 produces an audio signal which is selectively sampled at a predetermined rate by A/D converter 70 in response to control signals from microcomputer controller 76. The digitized samples are then loaded into memory 98 through interface 72 and computer 96.

The sequence is repeated a predetermined number of times and appropriate signal averaging performed by computer 96. Fourier transforms are then performed by computer 96 and the results displayed on CRT display 101.

Where a multi-line scan is to be effected, subsequent selective irradiations of parallel planes are performed by either changing the carrier frequency by appropriate loading of programmable frequency synthesizer 104 with the Larmor frequency $+\Delta f$ and/or appropriate changes made in the basic magnetic field by application of appropriate $\Delta B$ signals to $\Delta B$ coils 32A and 32B.

It should be appreciated that the above described apparatus is illustrative of the various types of apparatus that can be used to practice spin echo scanning sequences in accordance with the present invention. It should be appreciated that other apparatus can be utilized as well. For example, it is presently thought that the apparatus described in the Garroway et al. U.S. Pat. No. 4,021,726 can be adapted for a spin echo scanning sequence. Further, it should be noted that while the various conductors shown interconnecting the elements of FIGS. 11, 12 and 13 are shown as single lines, they are not so shown in a limiting sense and may comprise plural connections as is understood in the art.

It will be understood that the above description is of illustrative embodiments of the present invention, and that the invention is not limited to the specific forms shown. Modifications may be made in the sequence or arrangements of pulses or in the design or arrangement of elements without departing from the spirit of the invention as expressed in the appended claims.

What is claimed is:

1. A method for determining the relative densities of nuclei within an object, said nuclei having nuclear spins at Larmor frequencies in accordance with the intensity of a magnetic field operating thereon, the method comprising the steps of:

selectively effecting the generation of spin echo signals by nuclei disposed within a predetermined volume of said object by exciting intersecting regions in said object, said predetermined volume being defined by the intersection of said regions; and detecting the intensity of said spin echo signals to obtain a measure of the relative density of nuclei in said predetermined volume.

2. The method of claim 1 wherein said selectively effecting the generation of spin echo signals by nuclei disposed within a predetermined volume step comprises:

selectively exciting a first planar volume including said predetermined volume, to nutate the nuclear spins of nuclei in said first planar volume by approximately 90°; and selectively exciting a second planar volume, transverse to said first planar volume, at a predetermined time interval thereafter and including said predetermined volume in the intersection of said first and second planar volumes, to nutate the nuclear spins of nuclei in said second planar volume by approximately 180°; whereby the nuclei within said intersection thereafter generate spin echo signals at times in accordance with said predetermined time interval.

3. The method of claims 1 or 2 wherein said detecting step comprises:

receiving said spin echo signals;

generating a magnetic field across said predetermined volume having an intensity which varies as a function of position, during the reception of said spin echo signals; and developing indicia representing the relative intensities of different frequency components present in said spin echo signals.

4. A method for determining the relative densities of nuclei within an object, said nuclei having nuclear spins at Larmor frequencies in accordance with the intensity of the magnetic field operating thereon, the method comprising the steps of:

initially aligning the spins of said nuclei;

sequentially selectively exciting the nuclei disposed in a predetermined number of parallel first generally planar volumes within said object to reorient the nuclear spins of the nuclei in said first generally planar volumes by a first predetermined angle;

sequentially selectively exciting the nuclei disposed in a predetermined number of second generally planar volumes transverse to said first generally planar volumes and intersecting said first generally planar volumes within said object, to reorient the nuclear spins of the nuclei in said second generally planar volumes by a second predetermined angle, such that the nuclei disposed in the respective interesections of said first and second volumes generate, during respective subsequent time periods, respective spin echo signals; and determining from said respective spin echo signals the relative density of the nuclei disposed in the respective intersections.

5. The method of claim 4 wherein said determining step comprises:

generating during said subsequent time periods, position variant magnetic fields across said object such that the intensity of the magnetic field varies as a function of position within the respective intersections;

recording said spin echo signals in the presence of said position variant magnetic field; and developing indicia indicative of the relative intensities of the respective frequency components of said spin echo signals.

6. Apparatus for providing indicia of the relative nuclear densities of nuclei within an object, said nuclei having nuclear spins at Larmor frequencies in accordance with the intensity of the magnetic field operating thereon, said apparatus comprising:

means for initially aligning the nuclear spins of said nuclei;

means for sequentially selectively exciting the nulcei disposed in a predetermined number of parallel first generally planar volumes within said object to reorient the nuclear spins of the nuclei in said first generally planar volumes by a first predetermined angle;

means for sequentially selectively exciting the nuclei disposed in a predetermined number of second generally planar volumes transverse to said first generally planar volumes and intersecting said first generally planar volumes within said object, to reorient the nuclear spins of the nuclei in said second generally planar volumes by a second predetermined angle, such that the nuclear spins of nuclei disposed in the respective intersections of said first and second volumes generate, during respective subsequent time periods, respective spin echo signals; and means for receiving said respective spin ehco signals and determining therefrom the relative density of the nuclei disposed in the respective intersections.

7. The apparatus of claim 6 wherein said means for receiving said respective spin echo signals and determining therefrom the relative density of nuclei in the respective intersections includes means for generating, during said respective subsequent time periods, position variant magnetic fields wherein the intensity of said position variant field varies with position in the respective intersections; and means for developing the Fourier transform of said spin echo signals.

8. In a method for determining the relative densities within an object of nuclei having nuclear spins at Larmor frequencies in accordance with the intensity of the magnetic field operating thereon, the method being of the type including the steps of generating a sequence of position variant magnetic fields to sequentially vary the intensity of the magnetic fields within said object as a function of position in respective transverse directions, irradiating said object with a sequence of signals having respective predetermined frequency spectrums in the presence of associated ones of said position variant fields to selectively reorient the nuclear spins of nuclei having Larmor frequencies within said respective frequency spectrums and detecting signals generated by said nuclei, the improvement wherein said method further includes the steps of:

generating a further sequence of position variant magnetic fields, each sequential field being generated subsequent to a corresponding one of said first mentioned position variant magnetic fields, and operating to vary the intensity of the magnetic field within said object in a suitable direction relative to the direction of said corresponding first mentioned position variant field to correct for spurious phase spread within the object due to said corresponding first mentioned field.

9. Apparatus for providing indicia of the relative density of nuclei within a particular unit volume within an object comprising in combination:

means for initially aligning nuclear spins of nuclei in said object;

means for effecting a 90° rotation of the nuclear spins in first plane of unit volumes within said object including said particular unit volume;

means for effecting phase reversal of nuclear spins of atoms in a second plane of unit volumes within said object orthogonal to said first plane of unit volumes at a predetermined time thereto, such that those unit volumes in the intersection of said first and second planes generate a spin echo signal centered in time at a point after said phase reversal equal to said predetermined time interval, said particular unit volume being in said intersection;

means for generating during a period encompassing the generation of said spin echo signal, a magnetic field across said object with intensity varying as a function of position along said intersection between said first and second planes, whereby the nuclei in said particular volume assume nuclear spins at a predetermined Larmor frequency;

means for receiving said spin echo signal; and means for generating indicia of the intensity of respective frequency components of said spin echo signal, the intensity of the frequency components at said predetermined Larmor frequency being indicative of the respective relative spin densities of said particular unit volumes.

10. The apparatus of claim 9 wherein:

said means for effecting said 90° rotation comprises means for generating a position variant magnetic field across said object with intensity varying as a function of position along a first direction whereby nuclei in said first plane of unit volumes assume nuclear spins at Larmor frequencies within a first predetermined range of frequencies;

means for selectively irradiating said object with an electromagnetic signal of first predetermined amplitude and duration and having a frequency spectrum substantially consisting of components within said first predetermined range of frequencies;

and wherein said means for effecting phase reversal comprises:

means for generating a position variant magnetic field across said object with intensity varying as a function of position along a second direction whereby nuclei in said second plane of unit volumes assume nuclear spins at Larmor frequencies within a second predetermined range of frequencies; and means for selectively irradiating said object with an electromagnetic signal of second predetermined amplitude and duration and having a frequency spectrum substantially consisting of components within said second predetermined range of frequencies.

11. The apparatus of claim 10 wherein said respective means for selectively irradiating said object together comprises:

means for generating a carrier signal at a predetermined frequency;

means for controllably modulating said carrier signal with one of a predetermined set of predetermined waveform signals; and transmitter means for irradiating said object with said modulated signal; and wherein said means for generating indicia of the intensity of respective frequency components of said spin echo signal comprises:

quadrature demodulatory means, responsive to a signal indicative of said spin echo signal and respective inphase and quadrature signals indicative of said carrier signal, for generating respective output signals indicative of the frequency and phase differences between said spin echo signal and said inphase signal and said spin echo signal and said quadrature signal;

means for computing the vector sum of said respective quadrature modulator means output signal; and means for computing the Fourier transform of said vector sum to develop indicia of said frequency component.

12. The method of claim 1 wherein:

said selectively effecting step comprises the steps of:

disposing said object in an intense first magnetic field to align the nuclear spins of said atoms in accordance with a first predetermined direction;

generating for a first predetermined time period a first position variant magnetic field to vary the intensity of the magnetic field within said object in accordance with position along a second predetermined direction, said position variant magnetic field causing the Larmor frequencies of said nuclei to vary as a function of the relative positions of said nuclei along said second predetermined direction;

irradiating said object during said first predetermined period with a signal having a first frequency spectrum substantially consisting of components corresponding to a first predetermined band of said nuclei Larmor frequencies, to selectively excite said nuclei having Larmor frequencies within said predetermined band, such that the nuclear spins of nuclei located in a predetermined plane in said object are reoriented by a predetermined angle with respect to the previous orientation thereof;

generating during a second predetermined time period subsequent to said first time period, a second position variant magnetic field to vary the magnetic field within said object in the opposite direction from the said first position variant magnetic field to correct for phase spreading of nuclear spins of nuclei within said first predetermined plane which occurs during said first time period;

generating during a third predetermined time period subsequent to said first time period, a third position variant magnetic field to vary the magnetic field within said object in accordance with position along a third predetermined direction transverse to said second predetermined direction to spread the spin phases so that they may be subsequently refocused in the generation of the spin echo;

generating during a fourth predetermined time period subsequent to said third time period, a fourth position variant magnetic field to vary the magnetic field within said object in accordance with position along a fourth predetermined direction transverse to said second and third predetermined directions such that the Larmor frequencies of the nuclear spins of said atoms within said object vary as a function of the relative position of said nuclei along said third predetermined direction;

irradiating said object during said fourth predetermined time period with a second signal having a second frequency spectrum substantially consisting of frequency components corresponding to a second predetermined band of Larmor frequencies such that the nuclear spins of nuclei located in a second plane are reoriented by a predetermined angle with respect to the previous orientation thereof, said second plane intersecting said first plane along a line of intersection within said object, the nuclei located at the intersection of said planes thereafter during fifth time period generating spin echo signals at the respective Larmor frequencies thereof;

and said detecting step comprises:

generating during said fifth time period a fifth position variant magnetic field to vary the intensity of the magnetic field within said object in accordance with position along said line of intersection such that the Larmor frequencies of the nuclei vary as a function of relative position along said line of intersection; and determining the relative intensity of the frequency components of said spin echo signals, each of said spin echo signal frequency components being indicative of the relative density of nuclei disposed at an associated position along said line of intersection.

13. The method of claims 1, 2 or 12 further including the steps of:

effecting the generation of replica signals of said spin echo signals;

detecting the intensity of said replicas; and proessing said replica signals with said spin echo signals to develop processed signals indicative of the relative spin-density of said predetermined volume.

14. A method for determining the relative densities of nuclei within an object, said nuclei having nuclear spins at Larmor frequencies in accordance with the intensity of the magnetic field operating thereon, the method comprising the steps of:
   (a) disposing said object in an intense first magnetic field to align the nuclear spins of said nuclei in accordance with a first predetermined direction;
   (b) generating, for a first predetermined time period, a first position variant magnetic field to vary the intensity of the magnetic field within said object in accordance with position along a second predetermined direction such that the Larmor frequencies of said nuclei vary as a function of relative position along said second predetermined direction;
   (c) irradiating said object during said first predetermined period with a signal having a frequency spectrum substantially consisting of components corresponding to a predetermined band of said nuclear Larmor frequencies to selectively excite nuclei having Larmor frequencies within said predetermined band, such that the nuclear spins of nuclei located in a first predetermined plane in said object are reoriented by a first predetermined angle with respect to the orientation thereof;
   (d) generating during respective second predetermined time periods subsequent to said first time period, a second position variant magnetic field to vary the magnetic field within said object in accordance with position along a third predetermined direction such that the Larmor frequencies of nuclei within said object vary as a function of the relative position of said nuclei along said third predetermined direction, said third predetermined direction being transverse to said second predetermined direction;
   (e) irradiating said object during said respective second predetermined time periods with signals having respective frequency spectrums substantially consisting of components corresponding to predetermined bands of Larmor frequencies such that the nuclear spins of nuclei located in respective further planes are reoriented by a second predetermined angle with respect to the previous orientation thereof, said respective further planes being non-intersecting with respect to each other and each intersecting said first plane within said object along respective unique lines of intersection, thereafter during respective third time periods generating spin echo signals;
   (f) generating during said respective third time periods further position variant magnetic fields to vary the intensity of the magnetic field within said object in accordance with position along said lines of intersection such that the Larmor frequencies of the nuclei located along said lines of intersection vary as a function of relative position along said lines of intersection;
   (g) detecting said spin echo signals and determining the relative intensity of the frequency components thereof, each of said spin echo signal frequency components being indicative of the relative spin density of nuclei disposed at an associated position along said lines of intersection.

15. A method for determining the relative densities of nuclei within an object, said nuclei having nuclear spins at Larmor frequencies in accordance with the intensity of the magnetic field operating thereon, the method comprising the steps of:
   (a) disposing said object in an intense first magnetic field to align the nuclear spins of said nuclei in accordance with a first predetermined direction;
   (b) generating, for a first predetermined time period, a first position variant magnetic field to vary the intensity of the magnetic field within said object in accordance with position along a second predetermined direction such that the Larmor frequencies of said nuclei vary as a function of relative position along said second predetermined direction;
   (c) irradiating said object during said first predetermined period with a signal having a frequency spectrum substantially consisting of components corresponding to a predetermined band of said nuclear Larmor frequencies to selectively excite nuclei having Larmor frequencies within said predetermined band, such that the nuclear spins of nuclei located in a first predetermined plane in said object are reoriented by a first predetermined angle with respect to the orientation thereof;
   (d) generating during respective sequential second predetermined time periods subsequent to said first time period, a second position variant magnetic field to vary the magnetic field within said object in accordance with position along a third predetermined direction such that the Larmor frequencies of nuclei within said object vary as a function of the relative position of said nuclei along said third predetermined direction, said third predetermined direction being transverse to said second predetermined direction;
   (e) irradiating said object during said respective sequential second predetermined time periods with signals having a frequency spectrum substantially consisting of frequency components corresponding to a predetermined band of Larmor frequencies, to reorient the nuclear spins of nuclei having Larmor frequencies within said predetermined band of Larmor frequencies by a second predetermined angle with respect to the previous orientation thereof;
   (f) cumulatively changing the intensity of said first magnetic field by a predetermined amount during each second predetermined time period to change the particular nuclei having Larmor frequencies within said predetermined band of Larmor frequencies during each second predetermined time period, such that nuclear spins within respective further planes within said object are reoriented by said second predetermined angle, said further respective planes intersecting said first plane along respective unique lines of intersection, the nuclei disposed about said lines of intersection thereafter, during respective sequential third time periods, generating spin echo signals;
   (g) generating during said respective third time periods further position variant magnetic fields to vary the intensity of the magnetic field within said object in accordance with position along said lines of intersection such that the Larmor frequencies of the nuclei located along said lines of intersection vary as a function of relative position along said line of intersection; and (h) detecting said spin echo signals and determining the relative intensity of the frequency components thereof, each of said spin echo signal frequency components being indicative of the relative of nuclei disposed at an associated position along the line of intersection generating the spin echo.

16. A method for determining the relative densities of nuclei within an object, said nuclei having spins at Larmor frequencies in accordance with the intensity of the magnetic field operating thereon and being responsive only to signals at said Larmor frequency, the method comprising:

(a) disposing said object in an intense first magnetic field to align the nuclear spins of nuclei in accordance with a first predetermined direction;

(b) generating for a first predetermined time period a first position variant magnetic field to vary the intensity of the magnetic field within said object in accordance with the position along the X direction of a nominal Cartesian coordinate system, said position variant magnetic field causing the Larmor frequencies of said nuclei to vary as a function of the relative positions of said nuclei along said X direction;

(c) irradiating said object during said first predetermined period with a signal having a frequency spectrum substantially consisting of components corresponding to a first predetermined band of said Larmor frequencies, to reorient by approximately 90° the nuclear spins of a first volume of nuclei having Larmor frequencies within said first predetermined band of Larmor frequencies;

(d) generating, during a second predetermined time period subsequent to said first time period, a second position variant magnetic field to vary the magnetic field within said object in the opposite direction from the said first position variant magnetic field to correct for phase spreading of nuclear spins of nuclei within said first predetermined plane which occurs during said first time period;

(e) generating, during a third predetermined time period subsequent to said first time period, a third position variant magnetic field to vary the magnetic field within said object in accordance with position along the direction to said nominal Cartesian coordinate system to spread the spin phases so that they may be subsequently refocused to generate a spin echo;

(f) generating, during a fourth predetermined time period subsequent to said third time period, a fourth position variant magnetic field to vary the magnetic field within said object in accordance with position along the Y direction of said nominal Cartesian coordinate system such that the Larmor frequency of said nuclei within said object vary as a function of the relative position of said nuclei along said Y direction;

(g) irradiating said object during said fourth predetermined time period with a signal having a frequency spectrum substantially consisting of frequency components corresponding to a second predetermined band of Larmor frequencies to reorient by approximately 180° the nuclear spins of a second volume of nuclei having Larmor frequencies within said second predetermined band of Larmor frequencies, the nuclei common to both first and second volumes thereafter, during a fifth time period, generating a spin echo signal;

(h) generating during said fifth time period a fifth position variant magnetic field to vary the intensity of the magnetic field within said object in accordance with position along the Z direction of said nominal Cartesian coordinate system such that the Larmor frequencies of the nuclei common to said first and second volumes vary as a function of relative position along said Z direction; and (i) detecting said spin echo signal and determining the relative intensity of the frequency components thereof, each of said spin echo signal frequency components being indicative of the relative density within a particular unit volume of nuclei common to said first and second volumes.

17. A method for determining the relative nuclear spin densities of unit volumes within an object, said nuclei having nuclear spins at Larmor frequencies in accordance with the intensity of the magnetic field operating thereon, said nuclei being responsive only to signals at the Larmor frequency thereof, said object being conceptually disposed in a nominal Cartesian coordinate system having orthogonal X, Y and Z directions, the method comprising the steps of:

(a) applying an intense magnetic field to said object to initially align the nuclear spins of said nuclei;

(b) generating during a first predetermined number of sequential first time periods a magnetic gradient across said object along said X direction to vary the Larmor frequencies of said atoms in accordance with X position;

(c) irradiating said object, during at least a portion of each of said first time periods, with respective first signals, said first signals being of respective predetermined frequency spectrum corresponding to respective predetermined bands of Larmor frequencies, to reorient by approximately 90° the nuclear spins of nuclei disposed within respective predetermined ranges of X positions;

(d) generating during respective sequential second time periods subsequent to said first time periods, a magnetic gradient across said object along said Y direction to vary the Larmor frequencies of said nuclei in accordance with Y position;

(e) irradiating said object, during at least a portion of said each of said second predetermined time periods, with respective second signals, said second signals being of respective predetermined frequency spectra corresponding to respective predetermined bands of Larmor frequencies to reorient by approximately 180° the nuclear spins of nuclei disposed within respective predetermined ranges of Y positions, the nuclei disposed common to both one of said predetermined ranges of X position and one of said predetermined ranges of Y positions thereafter producing, during respective third time periods, spin echo signals at the respective Larmor frequencies of the nuclei;

(f) generating during said respective third time periods a magnetic gradient across said object along said Z direction to vary the Larmor frequencies of said nuclei common to a predetermined X range and predetermined Y range in accordance with Z position; and (g) detecting said spin echo signals and determining the relative intensity of the frequency components thereof, the intensities of the respective spin echo signal frequency components being indicative of the relative spin-density of nuclei within respective unit volumes of said atoms.

18. A method for determining the relative nuclear densities in an object comprising the steps of:
(a) disposing the object in an intense first magnetic field, said first field having a first predetermined direction, such that the nuclear spins of nuclei within the object align in accordance with said first predetermined direction;
(b) selectively superpositioning a second magnetic field, upon said first magnetic field such that the intensity of the composite field in the first predetermined direction varies with the position across the object in a second predetermined direction, said variation in magnetic field intensity creating a position related spectrum of nuclear spin frequencies across said object;
(c) selectively irradiating said object with a signal having a predetermined frequency spectrum such that the interaction of said signal spectrum and the spectrum of nuclear spin frequencies causes a first plane of nuclei in said object to be excited whereby the nuclear spins of the nuclei in said first plane are reoriented by a predetermined angle with respect to said first predetermined direction;
(d) replacing said second magnetic field, with a third magnetic field in superpositioned relation with said first magnetic field such that the intensity of the composite field in the first predetermined direction varies with position across the object in a direction opposite to said second magnetic field, said variation in magnetic field intensity correcting for phase spreading of nuclear spins of nuclei within said first plane which occurs during said first time period;
(e) replacing said third magnetic field, with a fourth magnetic field in superpositioned relation with said first magnetic field such that the intensity of the composite field in the first predetermined direction varies with position across the object in such a way that the phases of the spins are spread so that the spin phases may be subsequently refocused to generate a spin echo;
(f) replacing said fourth magnetic field with a fifth magnetic field in superpositioned relation with said first magnetic field such that the intensity of the composite field in the first predetermined direction varies with position across the object in a third predetermined direction perpendicular to said second predetermined direction, said variation in magnetic field intensity creating a position related spectrum of nuclear spin frequencies across said object in said third direction;
(g) selectively irradiating said object with a further signal having a predetermined frequency spectrum such that the interaction of said further signal spectrum and said nuclear spin frequency spectrum causes nuclei in a second plane in said object perpendicular to said first plane to be excited whereby the nuclear spins of the nuclei in said second plane are reoriented from their respective just preceding orientations by a predetermined angle, the nuclear spin of the nuclei disposed in the intersection of said first and second planes being affected by both said signals and producing after a predetermined time interval, spin echo signals;
(h) prior to said spin echo signal generation, replacing said fifth magnetic field with a sixth magnetic field in superpositioned relation with said first magnetic field such that the intensity of the composite field in the first predetermined direction varies with position across the object in a fourth predetermined direction perpendicular to both said second and third predetermined directions;
(i) detecting said spin echo signals; and
(j) calculating the frequency spectrum of said spin echo signals, the relative intensity of the respective frequency components of said spin echo signal being indicative of the relative nuclear density in an associated volume of said object.

19. A method for determining the relative nuclear densities in an object comprising the steps of:
(a) disposing the object in an intense first magnetic field, said first field having a first predetermined direction, such that the nuclear spins of nuclei within the object align in accordance with said first predetermined direction;
(b) selectively superpositioning for a first predetermined time period, a second magnetic field upon said first magnetic field such that the intensity of the composite field in the first predetermined direction varies with the position across the object in a second predetermined direction, said variation in magnetic field intensity creating a position related spectrum of nuclear spin frequencies across said object;
(c) selectively irradiating said object during said first predetermined time period with a first signal having a predetermined frequency spectrum such that the interaction of said signal spectrum and the spectrum of nuclear spin frequencies causes a first plane in said object to be excited whereby the nuclear spins of the nuclei in said first plane are reoriented by a predetermined phase angle with respect to said first predetermined direction;
(d) selectively superimposing for a second predetermined time period subsequent to said first time period, a third magnetic field on said first magnetic field such that the intensity of the composite field in the first predetermined direction varies with position across the object in a third predetermined direction perpendicular to said second predetermined direction, said variation in magnetic field intensity creating a position related spectrum of nuclear spin frequencies across said object in said third direction;
(e) selectively irradiating said object with at least one further signal during said second predetermined time period, said further signal having respective predetermined frequency spectrum such that the interaction of said further signal spectrum and said nuclear spin frequency spectrum causes nuclei in a further plane in said object perpendicular to said first plane to be excited whereby the nuclear spins of the nuclei in said further plane are reoriented from their respective just preceding orientations by a predetermined angle, the nuclear spin of the nuclei disposed in the intersections of said first and further plane being affected by said first signal and said further signal and producing after a predetermined time interval, a spin echo signal;
(f) selectively superpositioning for a third time period encompassing said spin echo signal generation, a fourth magnetic field on said first magnetic field such that the intensity of the composite field in the first predetermined direction varies with position across the object in a fourth predetermined direction perpendicular to both said second and third predetermined directions;

(g) detecting said spin echo signals; and (h) calculating the frequency spectrum of said spin echo signals, the relative intensity of the respective frequency components of said spin echo signal being indicative of the relative nuclear density in an associated volume of said object.

20. A method for determining the relative nuclear densities in an object comprising the steps of:

(a) disposing the object in an intense first magnetic field, said first field having a first predetermined direction, such that the nuclear spins of nuclei within the object align in accordance with said first predetermined direction;

(b) selectively superpositioning, for a first predetermined time period, a second magnetic field upon said first magnetic field such that the intensity of the composite field in the first predetermined direction varies with the position across the object in a second predetermined direction, said variation in magnetic field intensity creating a position related spectrum of nuclear spin frequencies across said object;

(c) selectively irradiating said object during at least a portion of said first predetermined time period with a first signal during a predetermined frequency spectrum such that the interaction of said signal spectrum and the spectrum of nuclear spin frequencies causes a first plane in said object to be excited whereby the nuclear spins of the nuclei in said first plane are reoriented by a predetermined angle with respect to said first predetermined direction;

(d) selectively superpositioning for a second predetermined time period subsequent to said first time period, a third magnetic field on said first magnetic field such that the intensity of the composite field in the first predetermined direction varies with position across the object in a third predetermined direction perpendicular to said second predetermined direction, said variation in magnetic field intensity creating a position related spectrum of nuclear spin frequencies across said object in said third direction;

(e) cumulatively changing the intensity of said first magnetic field by a predetermined amount during respective sequential predetermined periods;

(f) sequentially irradiating said object with at least one further signal, each said further signal having a respective predetermined frequency spectrum during said respective predetermined time periods such that the interaction of said further signal frequency spectrum and said nuclear spin frequency spectrum causes nuclei in a respective further plane in said object perpendicular to said first plane to be excited, whereby the nuclear spins of the nuclei in said further plane are reoriented from their respective just preceding orientations by a predetermined angle, the nuclear spins of the nuclei disposed in the intersections of said first and second planes being affected by both said first and further signals and producing after a respective time interval a respective spin echo signal;

(g) selectively superpositioning for a third time period encompassing said spin echo signal generation, a fourth magnetic field on said first magnetic field, such that the intensity of the composite field in the first predetermined direction varies with position across the object in a fourth predetermined direction perpendicular to both said second and third predetermined directions;

(h) detecting said spin echo signals; and (i) calculating the frequency spectrum of said spin echo signals, the relative intensity of the respective frequency components of said spin echo signals being indicative of the relative atom density in an associated volume of said object.

21. The method of claim 12 further including the steps of:

generating, during a sixth predetermined time period subsequent to said fifth time period, a sixth position variant magnetic field to vary the intensity of said magnetic field within said object in accordance with position along said third predetermined direction;

irradiating said object during said sixth predetermined time period with a third signal having said second frequency spectrum to effect subsequent generation, during a seventh predetermined time period, of a replica of said spin echo signals;

generating during said seventh predetermined time period a sixth position variant magnetic field to vary the intensity of the magnetic field within said object in accordance with position along said line of intersection;

detecting said replica; and processing said spin echo signals and said replicas in combination to develop a processed signal indicative of said relative density of nuclei.

22. The method of claim 14 further including the steps of:

generating, during respective fourth time periods subsequent to said third time periods, a fourth position variant magnetic field to vary the intensity of said magnetic field within said object in accordance with position along said third predetermined direction;

irradiating said object during at least a portion of said fourth predetermined time period with a third signal having a frequency spectrum which includes all frequencies of the irradiations of the second time periods to effect subsequent generation, during respective fifth predetermined time periods, of replica signals of said spin echo signals;

generating during said fifth predetermined time periods a fourth position variant magnetic field to vary the intensity of the magnetic field within said object in accordance with position along said line of intersection;

detecting said replicas; and processing said spin echo signals and said replicas in combination to develop a processed signal indicative of said density of nuclei.

23. The method of claim 15 further including the steps of:

generating, during respective fourth time periods subsequent to said third time periods, a fourth position variant magnetic field to vary the intensity of said magnetic field within said object in accordance with position along said third predetermined direction;

irradiating said object during at least a portion of said fourth predetermined time periods with a third signal having a frequency spectrum which includes all of the Larmor frequencies of the planes described in step (f) to effect subsequent generation, during respective fifth predetermined time periods, of replica signals of said spin echo signals;

generating during said fifth predetermined time periods a fourth position variant magnetic field to vary the intensity of the magnetic field within said object in accordance with position along said line of intersection;

detecting said replicas; and processing said spin echo signals and said replicas in combination to develop a processed signal indicative of said relative density of nuclei.

24. The method of claim 16 further including the steps of:

generating during a sixth predetermined time period, subsequent to said fifth predetermined time period, a sixth position variant magnetic field to vary the intensity of said magnetic field within said object in accordance with position along said Y direction of said nominal Cartesian coordinate system;

irradiating said object during at least a portion of said sixth predetermined time period with a third signal having said second frequency spectrum to effect subsequent generation, during a seventh predetermined time period, of replicas of said spin echo signals;

generating, during said seventh predetermined time period, a seventh position variant magnetic field to vary the intensity of the magnetic field within said object in accordance with position along said Z direction of said nominal Cartesian coordinate system;

detecting said replicas; and processing said spin echo signals and said replicas in combination to develop a processed signal indicative of said relative density of nuclei.

25. The method of claim 17 further including the steps of:

generating during respective fourth predetermined time periods subsequent to said third time periods a fourth position variant magnetic field to vary the intensity of said magnetic field within said object in accordance with Y position;

irradiating said object during at least a portion of said fourth predetermined time period with a third signal having a frequency spectrum including said respective predetermined frequency spectrums of step (e) to effect subsequent generation during a fifth predetermined time period of replicas of said spin echo signals;

generating during said fifth predetermined time period a fourth position variant magnetic field to vary the intensity of the magnetic field within said object in accordance with Z position;

detecting the respective frequency components of said replicas; and processing said spin echo signals and said replicas in combination to develop a processed signal indicative of said density of nuclei.

26. Apparatus for providing indicia of the relative nuclear densities of unit volumes within an object, said nuclei having nuclear spins at Larmor frequencies in accordance with the intensity of the magnetic field operating thereon, said apparatus comprising:

means responsive to control signals applied thereto for generating an intense first magnetic field across said object aligning the nuclear spins of said nuclei in accordance with a first predetermined direction;

first means for generating, during a first predetermined time period, a first position variant magnetic field which varies the intensity of the magnetic field within said object in accordance with position along a second predetermined direction such that the Larmor frequencies of said nuclear spins vary as a function of the relative positions of said nuclei along a second predetermined direction;

second means for irradiating said object during said first predetermined period with a signal having a frequency spectrum substantially consisting of components corresponding to a predetermined band of said Larmor frequencies to selectively excite nuclei having Larmor frequencies within said predetermined band, such that the nuclear spins of nuclei located in a first predetermined plane in said object are reoriented by a first predetermined angle with respect to the orientation thereof;

third means for generating, during respective sequential second predetermined time periods subsequent to said first time period, a second position variant magnetic field which varies the magnetic field within said object in accordance with position along a third predetermined direction such that the Larmor frequencies of nuclei within said object vary as a function of the relative position of said nuclei along said third predetermined direction, said third predetermined direction being transverse to said second predetermined direction, fourth means for irradiating said object during said respective sequential second predetermined time periods with signals having a frequency spectrum substantially consisting of frequency components corresponding to a predetermined band of Larmor frequencies, to reorient the nuclear spins of nuclei having Larmor frequencies within said predetermined band of Larmor frequencies by a second predetermined angle with respect to the previous orientation thereof;

fifth means for generating control signals to said first means to selectively vary the intensity of said first magnetic field by respective predetermined amounts during each second predetermined time period to change the particular nuclei having Larmor frequencies within said predetermined band of Larmor frequencies during each second predetermined time period, such that respective further planes within said object are reoriented by said second predetermined angle, said further respective planes intersecting said first plane along respective unique lines of intersection, the nuclei disposed along said lines of intersection thereafter, during respective sequential third time periods, generating spin echo signals;

sixth means for generating, during said respective third time periods, further position variant magnetic fields which vary the intensity of the magnetic field within said object in accordance with position along said lines of intersection such that the Larmor frequencies of the nuclei located along said lines of intersection vary as a function of relative position along said line of intersection; and seventh means for detecting said spin echo signals and determining the relative intensity of the frequency components thereof, each of said spin echo signal frequency components being indicative of the relative density of atoms disposed at an associated position along the said line of intersection generating the spin echo;

eighth means cooperating with said first, third and fifth means, for selectively varying the intensity of the magnetic field within said object in accordance with position along the second and third directions and along said lines of intersection during various of the predetermined time periods to effect correction of spurious spin phase spreading.

27. An apparatus for determining the relative nuclear densities of unit volumes within an object, said nuclei having nuclear spins of Larmor frequencies in accordance with the intensity of the magnetic field operating thereon, said nuclei being responsive only to signals at the Larmor frequency thereof, said object being conceptually disposed in a nominal Cartesian coordinate system having orthogonal X, Y and Z directions, the method comprising the steps of:

first means responsive to control signals applied thereto for controllably generating a position independent magnetic field across said object along said Z direction;

second means, responsive to control signals applied thereto, for controllably generating respective position variant magnetic fields across said object whereby the intensity of the magnetic field in the Z direction across said object varies as a function of X, Y and Z position respectively to accordingly vary the Larmor frequencies of nuclear spins in said object as a function of X, Y and Z positions, respectively;

third means, responsive to control signals applied thereto for generating a carrier signal at a predetermined carrier frequency;

fourth means, responsive to control signals applied thereto for controllably generating a modulation signal of selected predetermined waveform, amplitude and duration;

fifth means, responsive to said modulation signal and said carrier signal for modulating said carrier signal with said modulation signal and irradiating said object with the modulated signal;

sixth means, for generating a first set of control signals to said second, third and fourth means to effect, during a predetermined number of sequential first time periods, generation of an X position variant field and irradiation of said object by respective first signals of a first predetermined amplitude and duration and of respective predetermined frequency spectra corresponding to particular ranges of Larmor frequencies, such that nuclear spins within respective Y-Z planes in said object are reoriented by approximately 90°;

for generating a second set of control signals to said second, third and fourth means to effect, during a predetermined number of sequential second periods subsequent to said first time periods, generation of a Y position variant magnetic field and irradiation of said object with respective second signals of a second predetermined amplitude and duration and of respective frequency spectra corresponding to particular ranges of Larmor frequencies such that nuclear spins within respective X-Z planes are reoriented by approximately 180°, said respective X-Z planes intersecting said respective X-Z planes intersecting said respective Y-Z planes along respective unique lines of intersection within said object said intersection subsequently generating spin echo signals; and for generating a third set of control signals to said second means to effect generation of respective Z gradients at times in accordance with the time intervals between the irradiations of said object with the respective first signals and second signals, such that said spin echo signals are generated in the presence of said Z gradients;

seventh means for receiving said spin echo signals and generating signals indicative thereof;

quadrature demodulator means, responsive to signals indicative of said spin echo signals and respective inphase and quadrature signals indicative of said carrier signal, for generating respective output signals indicative of the frequency and phase differences between said spin echo signals and said inphase signal and said spin echo signals and said quadrature signal;

means for computing the vector sums of said respective quadrature demodulator means output signals; and means for computing the Fourier transforms of said vector sums to develop indicia of said frequency components; and eighth means for applying control signals to said second means to apply position variant magnetic fields across said object during various of the predetermined time periods to effect correction of spurious spin phase spreading.

28. An apparatus for determining the relative nuclear densities of unit volumes within an object, said atoms having nuclear spins of Larmor frequencies in accordance with the intensity of the magnetic field operating thereon, said nuclei being responsive only to signals at the Larmor frequency thereof, and said object being conceptually disposed in a nominal Cartesian coordinate system having orthogonal X, Y and Z directions, the method comprising the steps of:

first means responsive to control signals applied thereto for controllably generating a position independent magnetic field across said object along said Z direction;

second means, responsive to control signals applied thereto, for controllably generating respective position variant magnetic fields across said object whereby the intensity of the magnetic field in the Z direction across said object varies as a function of X, Y or Z position respectively to accordingly vary the Larmor frequencies of nuclear spins in said object as a function of X, Y or Z positions, respectively;

third means, responsive to control signals applied thereto for generating a carrier signal at a predetermined carrier frequency;

fourth means, responsive to control signals applied thereto for controllably generating a modulation signal of selected predetermined waveform, amplitude and duration;

fifth means, responsive to said modulation signal and said carrier signal for modulating said carrier signal with said modulation signal and irradiating said object with the modulated signal;

sixth means, for generating a first set of control signals to said first, second, third and fourth means to effect, during a predetermined number of sequential first time periods, generation of said position independent magnetic field at respective predetermined intensities, generation of an X position variant field and irradiation of said object by respective first signals of a first predetermined amplitude and duration and of a predetermined frequency spectrum corresponding to a particular range of Larmor frequencies such that nuclear spins within respective Y-Z planes in said object assume said particular range of Larmor frequencies in sequence and are reoriented by approximately 90°;

for generating a second set of control signals to said first, second, third and fourth means, to effect, during a predetermined number of sequential second periods, subsequent to said first time periods, generation of said position independent magnetic field respective predetermined intensities, generation of a Y position variant magnetic field and irradiation of said object with respective second signals of a second predetermined amplitude and duration and of respective frequency spectra corresponding to particular ranges of Larmor frequencis such that nuclear spins within respective X-Z planes intersecting said respective Y-Z planes along respective unique lines of intersection within said object and intersection subsequently generating spin echo signals;

for generating a third set of control signals to said second means to effect generation of respective Z gradients at times in accordance with the time intervals between the irradiations of said object with the respective first signals and second signals, such that said spin echo signals are generated in the presence of said Z gradients; and for generating a fourth set of control signals to said second means to effect generation of respective X, Y and Z gradients during portions of said first and second predetermined time periods and during portions of the time period during which said spin echoes occur to effect correction of spurious spin phase spreading:

seventh means for receiving said spin echo signals and generating signals indicative thereof;

quadrature demodulator means, responsive to signals indicative of said spin echo signals and respective inphase and quadrature signals indicative of said carrier signal, for generating respective output signals indicative of the frequency and phase differences between said spin echo signals and said inphase signal and said spin echo signals and said quadrature signal;

means for computing the vector sums of said respective quadrature modulator means output signals; and means for computing the Fourier transforms of said vector sums to develop indicia of said frequency components.

29. The methods of claims 12 or 16 wherein said third predetermined time period at least partially overlaps said second predetermined time period.

30. A method as in claim 1, 4, 8, 14, 15, 16, 17, 18, 19 or 20 wherein said relative densities are $T_1$ modified densities.

31. Apparatus as in claim 6, 9, 26, 27 or 28 wherein said relative densities are $T_1$ modified densities.

32. A method as in claim 1, 4, 8, 14, 15, 16, 17, 18, 19 or 20 wherein said relative densities are $T_2$ modified densities.

33. Apparatus as in claim 6, 9, 26, 27 or 28 wherein said relative densities are $T_2$ modified densities.

34. A method as in claim 1, 4, 8, 14, 15, 16, 17, 18, 19, or 20 wherein said relative densities are relative normal densities.

35. Apparatus as in claim 6, 9, 26, 27 or 28 wherein said relative densities are relative normal densities.

* * * * *

UNITED STATES PATENT AND TRADEMARK OFFICE
Certificate

Patent No. 4,297,637                      Patented October 27, 1981

On petition requesting issuance of a certificate for correction of inventorship pursuant to 35 USC 256, it has been found that the above-identified patent, through error and without any deceptive intent, improperly sets forth the inventorship. Accordingly, it is hereby certified that the correct inventorship of this patent is Lawrence E. Crooks, John C. Hoenninger, III., Mitsuaki Arakawa and Jerome R. Singer.

Signed and Sealed this sixth Day of May 1986.

BRADLEY R. GARRIS,
*Office of the Deputy Assistant Commissioner for Patents.*